US012753495B2

(12) United States Patent
Tillmann et al.

(10) Patent No.: US 12,753,495 B2
(45) Date of Patent: Oct. 6, 2026

(54) PROCESS FOR MANUFACTURING SILICON-CONTAINING MATERIALS IN A CASCADE REACTOR SYSTEM

(71) Applicant: Wacker Chemie AG, Munich (DE)

(72) Inventors: Jan Tillmann, Munich (DE); Christoph Dräger, Munich (DE); Alena Kalyakina, Munich (DE); Sebastian Kneissl, Munich (DE); Thomas Renner, Munich (DE)

(73) Assignee: Wacker Chemie AG, Munich (DE)

( * ) Notice: Subject to any disclaimer, the term of this patent is extended or adjusted under 35 U.S.C. 154(b) by 0 days.

(21) Appl. No.: 18/579,579

(22) PCT Filed: Jul. 29, 2021

(86) PCT No.: PCT/EP2021/071308

§ 371 (c)(1),
(2) Date: Jan. 16, 2024

(87) PCT Pub. No.: WO2023/006209

PCT Pub. Date: Feb. 2, 2023

(65) Prior Publication Data

US 2024/0318308 A1 Sep. 26, 2024

(51) Int. Cl.

| | |
|---|---|
| ***C23C 16/44*** | (2006.01) |
| ***C01B 33/029*** | (2006.01) |
| ***C23C 16/30*** | (2006.01) |
| ***H01M 4/587*** | (2010.01) |

(52) U.S. Cl.

CPC ........ *C23C 16/4417* (2013.01); *C01B 33/029* (2013.01); *C23C 16/30* (2013.01); *H01M 4/587* (2013.01); *C01P 2004/80* (2013.01); *C01P 2006/12* (2013.01); *C01P 2006/40* (2013.01)

(58) Field of Classification Search

CPC .................................................. C23C 16/4417

See application file for complete search history.

(56) References Cited

U.S. PATENT DOCUMENTS

| | | | | |
|---|---|---|---|---|
| 10,147,950 | B2 | 12/2018 | Sakshaug et al. | |
| 10,424,786 | B1 | 9/2019 | Mason et al. | |
| 10,508,335 | B1 | 12/2019 | Yilmaz et al. | |
| 10,559,812 | B2 | 2/2020 | Matsuno et al. | |
| 10,819,400 | B2 | 10/2020 | Ma et al. | |
| 2015/0329366 | A1* | 11/2015 | Chew | C01B 33/021 423/348 |
| 2022/0336791 | A1* | 10/2022 | Mason | H01M 4/134 |

FOREIGN PATENT DOCUMENTS

| | | | |
|---|---|---|---|
| EP | 1730800 | B1 | 7/2008 |
| EP | 3335262 | B1 | 6/2019 |
| GB | 2584615 | A | 12/2020 |
| GB | 2587326 | A | 3/2021 |
| KR | 20210039962 | A | 4/2021 |
| WO | 2012097969 | A1 | 7/2012 |

OTHER PUBLICATIONS

M. Obrovac et al, Chem. Rev. 2014, vol. 114, p. 11444.
Motevalian et al, Industrial & Engineering Chemistry Research 2017, vol. 56, p. 14995-15000.
J.O. Odden et al., Solar Energy Materials & Solar Cells 2005, vol. 86, p. 165.

* cited by examiner

*Primary Examiner* — Austin Murata

(57) ABSTRACT

Silicon-containing materials along with process for producing the same. Where the silicon-containing materials are produced by thermal decomposition of one or more silicon precursors in the presence of one or more porous particles. Where an amount of silicon is deposited within pores and on a surface of the one or more porous particles while in a cascade reactor system which includes a plurality of reactors.

11 Claims, No Drawings

PROCESS FOR MANUFACTURING SILICON-CONTAINING MATERIALS IN A CASCADE REACTOR SYSTEM

CROSS-REFERENCE TO RELATED APPLICATIONS

This application is a U.S. National Phase application of PCT Application NO. PCT/EP2021/071308 filed on Jul. 29, 2021, which is incorporated by reference herein in their entirety.

The invention relates to a process for producing silicon-containing materials by thermal decomposition of silicon precursors in the presence of porous particles, where silicon is deposited in pores and on the surface of the porous particles, and also to the use of the resultant silicon-containing materials as active materials for anodes of lithium-ion batteries.

As storage media for electrical power, lithium-ion batteries are currently the practical electrochemical energy stores having the highest energy densities. Lithium-ion batteries are utilized primarily in the area of portable electronics, for tools, and also for electrically driven transportation means, such as bicycles, scooters or automobiles. A widespread active material currently for the negative electrode ("anode") of corresponding batteries is graphitic carbon. A disadvantage, however, is the relatively low electrochemical capacity of such graphitic carbons, which is theoretically at most 372 mAh per gram of graphite and therefore corresponds only to about a tenth of the electrochemical capacity theoretically achievable with lithium metal. Alternative active materials for the anode use an addition of silicon, as described for example in EP 1730800 B1, in U.S. Pat. Nos. 10,559,812 B2, in 10,819,400 B2, or in EP 3335262 B1. Silicon with lithium forms binary, electrochemically active alloys which enable very high electrochemically achievable lithium contents of up to 3579 mAh per gram of silicon [M. Obrovac, V. L. Chevrier *Chem. Rev.* 2014, 114, 11444].

The intercalation and deintercalation of lithium ions in silicon is associated with the disadvantage of an accompanying very sharp change in volume, which in the case of complete intercalation can reach up to 300%. Such changes in volume subject the silicon-containing active material to severe mechanical loading, possibly resulting in the active material ultimately breaking apart. In the active material and in the electrode structure, this process, also referred to as electrochemical grinding, leads to a loss of electrical contacting and hence to the sustained, irreversible loss of capacity on the part of the electrode.

Additionally, the surface of the silicon-containing active material reacts with constituents of the electrolyte to form, continuously, passivating protective layers (solid electrolyte interphase; SEI). The components formed are no longer electrochemically active. The lithium bound within them is no longer available to the system, so leading to a pronounced and continuous loss of capacity on the part of the battery. Because of the extreme change in volume of the silicon during battery charging/discharging, the SEI regularly breaks up, meaning that further, as yet unoccupied surfaces of the silicon-containing active material are exposed, and are then subject to further SEI formation. Since in the complete cell, the amount of mobile lithium, which corresponds to the useful capacity, is limited by the cathode material, it is increasingly consumed, and the capacity of the cell after just a few cycles drops to an extent unacceptable from a performance standpoint.

The reduction in capacity in the course of multiple charging and discharging cycles is also referred to as fading or continuous capacity loss, and is generally irreversible.

As active materials for anodes of lithium-ion batteries, a series of silicon-carbon composite particles have been described, in which the silicon is incorporated into porous carbon particles starting from gaseous or liquid precursors.

For example, U.S. Pat. No. 10,147,950 B2 describes the deposition of silicon from monosilane $SiH_4$, in a porous carbon in a tube furnace or comparable furnace types at elevated temperatures of 300 to 900° C., preferably with agitation of the particles, through a process of CVD (chemical vapor deposition) or PE-CVD (plasma-enhanced chemical vapor deposition). This process employs a mixture of 2 mol % of monosilane with nitrogen as inert gas. As a result of the low concentration of the silicon precursor in the gas mixture, the reaction times are very long. Additionally, U.S. Pat. No. 10,147,950 B2 discloses a multiplicity of possible combinations of different temperature ranges from 300 to 900° C. with different pressure ranges from 0.01 to 100 bar in order to implement the deposition of silicon on and in porous starting materials.

An analogous procedure is described in U.S. Pat. No. 10,424,786 B1, where the silicon precursors are introduced as a mixture with inert gas under an overall pressure of 1.013 bar. WO2012/097969 A1 describes the deposition of ultrafine silicon particles in the range from 1 to 20 nm through heating of silanes as the silicon precursor on porous carbon supports at 200 to 950° C., the silane being diluted with an inert gas in order to prevent agglomeration of the deposited silicon particles and/or formation of thick layers; the deposition takes place in a pressure range from 0.1 to 5 bar.

Motevalian et al., Ind. Eng. Chem. Res. 2017, 56, 14995, describe the deposition of silicon layers at elevated pressure, albeit not in the presence of a porous matrix. Again, the silicon precursor used, in this case monosilane $SiH_4$, is present only at a low concentration of at most 5 mol % in the overall gas volume.

The processes described above have a range of serious disadvantages. The silicon precursor is usually used at low absolute and partial pressures and hence at low concentration, thereby necessitating long reaction times in order to achieve high silicon fractions in the silicon-containing material. Another disadvantage with these processes is that only a small part of the reactive gas supplied undergoes reaction, and so the outgoing gas from the reactor must undergo a costly and inconvenient operation of recycling or disposal, which further increases the costs, particularly when using silicon precursors, which are subject to demanding technical safety requirements.

Against this background, the object was to provide a process for producing silicon-containing materials, preferably with high storage capacity for lithium ions, which when used as an active material in anodes of lithium-ion batteries enable a high cycling stability, starting from porous particles and silicon precursors, the process being technically simple to implement and being devoid of the disadvantages of the above-described processes of the prior art, especially in terms of the reaction times.

Surprisingly the object has been achieved substantially through a process in which silicon is deposited in pores and on the surface of porous particles in a cascade reactor system by decomposition of silicon precursors at a pressure of at least 7 bar. This is particularly surprising insofar as it is known, from processes for producing polycrystalline silicon, that the deposition of silicon at relatively high pressure is accompanied by increased and unwanted formation of dust (J. O. Odden et al., *Solar Energy Mat. & Solar Cells* 2005, 86, 165), which is counterproductive both to the deposition of silicon on the inner surface of the pores and outer surface of the porous particles and for the product yield. This deleterious effect is surprisingly overcome by the process of the invention.

The production of silicon-containing materials, as active materials for anodes of lithium-ion batteries, for example, starting from porous particles and silicon precursors under pressure according to the invention, is of particular economic interest, since it enables surprisingly increased amounts of silicon precursor substances in the porous particles and hence reduced reaction times. A further economic advantage of the process lies in the higher silicon yield in relation to the silicon precursor employed. Moreover, the deposition of silicon is particularly uniform and occurs in particular in the porous particles, so resulting in high stability of the resultant silicon-containing material in application as an active material in anodes for lithium-ion batteries, with at the same time a low change in volume during cycling. In contrast to the production of the relevant materials in only one reactor (not in accordance with the invention), the cascade reactor procedure has the advantage that the long cooling and heating phases of one reactor are reduced. This carries with it an advantage in terms of time and energy technology relative to only one reactor, and reduces the physical stress on the reactors.

The invention provides a process for producing silicon-containing materials by thermal decomposition of one or more silicon precursors in the presence of one or more porous particles, where silicon is deposited in pores and on the surface of the porous particles, in a cascade reactor system comprising a plurality of reactors.

In one preferred embodiment the process comprises at least the Phases 1 to 7:

Phase 1: filling a reactor A with porous particles and pretreating the particles, Phase 2: transferring the pretreated particles into a reactor B and charging the reactor with a reactive component comprising at least one silicon precursor, Phase 3: heating the reactor B to a target temperature, at which the silicon precursor begins to decompose in the reactor, Phase 4: decomposing the silicon precursor, with deposition of silicon in pores and on the surface of the porous particles, with formation of the silicon-containing materials and with the pressure increasing to at least 7 bar, Phase 5: cooling the reactor B, Phase 6: removing gaseous reaction products, formed in the course of the deposition, from the reactor B and transferring the silicon-containing materials into a reactor C, Phase 7: withdrawing the silicon-containing materials from the reactor C.

In one preferred embodiment Phase 1 is configured as follows:

Phase 1

Phase 1.1: filling the reactor A with the porous particles,

Phase 1.2: pretreating the particles in reactor A,

Phase 1.3: transferring the pretreated particles into the reactor B, or interim storage into a reservoir vessel D and subsequent transfer into the reactor B, or the material remains in reactor A.

In one preferred embodiment Phase 2 is configured as follows:

Phase 2

Phase 2.1: heating or cooling of the particles in reactor B, optionally Phase 2.2: establishing the pressure in reactor B optionally Phase 2.3: charging reactor B with at least one silicon-free reactive component, Phase 2.4: charging the reactor B with at least one reactive component comprising at least one silicon precursor.

In one preferred embodiment Phase 3 is configured as follows:

Phase 3

Phase 3.1: heating the reactor B to a target temperature, at which the reactive component begins to decompose in reactor B.

If at least one silicon-free reactive component is in reactor B, there follows preferably Phase 3.2:

Phase 3.2: decomposing the reactive component which contains no Si precursor.

In one preferred embodiment Phase 4 is configured as follows:

Phase 4

Phase 4.1: decomposing the silicon precursor, with deposition of silicon in pores and on the surface of the porous particles, with the pressure increasing to at least 7 bar Phase 4.2: establishing a minimum temperature or a temperature profile for a defined period in which a pressure of at least 7 bar comes about.

In one preferred embodiment Phase 5 is configured as follows:

Phase 5

Phase 5.1: adjusting the pressure in reactor B to a defined pressure.

Phase 5.2: adjusting the reactor B to a defined temperature or a defined temperature profile.

In one preferred embodiment Phase 6 is configured as follows:

Phase 6

Phase 6.1: removing gaseous reaction products, formed in the course of the deposition, from the reactor B, Phase 6.2: transferring the particles into a reactor C, or interim storage into a reservoir vessel E and subsequent transfer into reactor C, or the material remains in reactor B, Phase 6.3: adjusting reactor C to a defined temperature or a defined temperature profile and a defined pressure.

In one preferred embodiment Phase 7 is configured as follows:

Phase 7

Phase 7.1: aftertreating the particles in reactor C to deactivate the particle surfaces, Phase 7.2: cooling the particles to a defined temperature and withdrawing silicon-containing materials from reactor C, and preferably direct transfer into a reservoir vessel E or direct filling into a suitable container.

In Phase 1.1 porous particles are filled into a heatable and/or vacuum-rated and/or pressure-rated reactor A; this filling may take place manually or automatically.

The filling of reactor A with porous particles may be carried out, for example, under an inert gas atmosphere or, preferably, ambient air. Examples of inert gas which can be used include hydrogen, helium, neon, argon, krypton, xenon, nitrogen or carbon dioxide, or mixtures thereof, such as forming gas, for example. Argon or, in particular, nitrogen is preferred.

Automatic filling may be accomplished, for example, using a metering screw, star wheel, vibrating trough, plate-type metering device, belt-type metering device, vacuum metering system, negative weighing out or other metering system, from, for example, a silo, a bag shaker or other container system.

The aim of pretreating the particles in reactor A in Phase 1.2 is to remove air/oxygen, water or dispersants, such as, for example, surfactants or alcohols, and impurities from the particles. This may be achieved by inertization by inert gas, raising of the temperature to up to 1000° C., reduction of the pressure to down to 0.01 mbar, or a combination of the individual operating steps. Inert gas used may be, for example, hydrogen, helium, neon, argon, krypton, xenon, nitrogen or carbon dioxide, or mixtures thereof, such as forming gas, for example. Argon or, in particular, nitrogen is preferred.

The aim of the pretreatment in Phase 1.2 may also be to modify the chemical surface nature of the porous particles with further substances. The addition may be made before or after drying, and there may be a further heating step before the material is transferred into Phase 1.3. The substances may be introduced into the reactor in gaseous, solid or liquid form or as a solution; mixtures, emulsions, suspensions, aerosols or foams are also possible. The substances in question may be, for example, carbon dioxide, water, sodium hydroxide, potassium hydroxide, hydrofluoric acid, phosphoric acid, nitric acid, ammonium dihydrogenphosphate, lithium nitrate, sodium nitrate, potassium nitrate, lithium chloride, sodium chloride, potassium chloride, lithium bromide, sodium bromide, potassium bromide, alkoxides.

The transfer in Phase 1.3 may be accomplished, for example, by a drop tube, continuous conveyor, flow conveyor/suction or pressure conveying unit (e.g. vacuum conveyor, transport blower); mechanical conveyors (e.g. roller conveyors with drive, screw conveyors, circular conveyors, circulation conveyors, bucket unit, star wheel locks, chain conveyors, scraper conveyors, belt conveyors, oscillation conveyors); gravity conveyors (e.g. chutes, roller bed, ball bed, rail bed), and also by means of non-continuous conveyors, floor-based and rail-free (e.g. automated vehicle, manual forklift truck, electric forklift truck, driverless transport systems (DTS), air-cushion vehicle, hand cart, electric cart, motor vehicle (tractor, wagon, forklift stacker), transfer carriage, transfer/lift carriage, shelf access device (with/without converter, able to follow curved paths); floor-based, rail-bound (e.g. plant railway, track vehicle; floor-free (e.g. trolley track, crane (e.g. bridge crane, portal crane, jib crane, tower crane), electric overhead track, small-vessel transport system; fixed (e.g. elevator, service lift and cherry picker, stepwise conveyor).

The reservoir vessel D may be temperature-conditionable, movable, insulated, or connected by a tube system to reactor B.

In Phase 2.1 the pretreated material in reactor B is brought preferably to a temperature of 100 to 1000° C., more preferably 250 to 500° C. and especially preferably 300 to 400° C.

In the optional Phase 2.2, reactor B is adjusted preferably to a pressure of 0.01 mbar to 100 bar, more preferably 0.01 mbar to 10 bar and especially preferably 50 mbar to 3 bar. The pressure may be adjusted using inert gases and/or reactive gases. Inert gas used may be, for example, hydrogen, helium, neon, argon, krypton, xenon, nitrogen, carbon dioxide or steam, or mixtures thereof, such as forming gas, for example. Preference is given to argon, nitrogen or, in particular, hydrogen. The substances may be introduced into reactor B simultaneously, for example by way of a T-piece or an upstream mixing block, or in succession; the reactor B may optionally be evacuated beforehand.

The reactor B in Phase 2.2 is preferably charged with inert gas or evacuated initially, in other words, in particular, before the reactor B is charged with reactive component in Phase 2.3 and/or 2.4.

In the optional Phase 2.3, the reactor B is charged with a reactive component which contains no silicon precursor.

In Phase 2.4 the reactor B is charged with a reactive component comprising at least one silicon precursor.

In one variant of the process the reactive component is introduced into the reactor directly into the bed of porous particles, for example from below or via a specific agitator. This variant is particularly preferred when metering into a reactor B at a pressure below 1 bar before the addition is commenced.

The reactor B is preferably charged with an amount of reactive component such that, in relation to the amount of porous particles weighed in, an amount of silicon sufficient for the target capacity of the silicon-containing material to be produced is deposited. This may take place at one step or in plural iterations of Phases 2.1 to 6.1.

Charging means generally the introduction of the reactive component into the reactors. During introduction into the reactors, the constituents of the reactive component may be present for example in gaseous, liquid or sublimable solid form. The reactive component is preferably gaseous, liquid, solid, sublimable for example, or a composition optionally consisting of substances in different states of matter.

The reactive component from Phase 2.4 comprises at least one silicon precursor and optionally an inert gas constituent. The one or more silicon precursors may generally be introduced as mixture or separately, or in a mixture with inert gas constituents, or as pure substances, into reactor B. The reactive component preferably comprises an inert gas constituent of 0 to 99%, more preferably at most 50%, especially preferably at most 30%, and very preferably at most 5%, based on the partial pressure of the inert gas constituent within the overall pressure of the reactive component under standard conditions (according to DIN 1343). In one very preferred embodiment the reactive component contains no inert gas constituent.

The silicon precursor comprises at least one reactive component which is able to react to form silicon under the selected conditions, of thermal treatment, for example.

The reactive component is preferably selected from the group containing silicon-hydrogen compounds such as monosilane $SiH_4$, disilane $Si_2H_6$ and also higher linear, branched or else cyclic homologs, neo-pentasilane $Si_5H_{12}$, cyclo-hexasilane $Si_6H_{12}$, chlorine-containing silanes, such as, for example, trichlorosilane $HSiCl_3$, dichlorosilane $H_2SiCl_2$, chlorosilane $H_3SiCl$, tetrachlorosilane $SiCl_4$, hexachlorodisilane $Si_2Cl_6$, and also higher linear, branched or else cyclic homologs such as, for example, 1,1,2,2-tetrachlorodisilane $Cl_2HSi—SiHCl_2$, chlorinated and part-chlorinated oligo- and polysilanes, methylchlorosilanes, such as, for example, trichloromethylsilane $MeSiCl_3$, dichlorodimethylsilane $Me_2SiCl_2$, chlorotrimethylsilane $Me_3SiCl$, tetramethylsilane $Me_4Si$, dichloromethylsilane $MeHSiCl_2$, chloromethylsilane $MeH_2SiCl$, methylsilane $MeH_3Si$, chlorodimethylsilane $Me_2HSiCl$, dimethylsilane $Me_2H_2Si$, trimethylsilane $Me_3SiH$, or else mixtures of the silicon compounds described.

In one specific embodiment of the process the monosilane or mixtures of silanes such as, for example, mixtures of monosilane $SiH_4$, trichlorosilane $HSiCl_3$, dichlorosilane $H_2SiCl_2$, monochlorosilane $H_3SiCl$ and tetrachlorosilane $SiCl_4$, where each constituent may be present from 0 to 99.9 wt %, is produced by a suitable process only directly before deployment in the reactor. Generally speaking, these processes start from trichlorosilane $HSiCl_3$, which is rearranged over a suitable catalyst (e.g. AmberLyst™ A21 DRY) to form the other components of the mixture described. The composition of the resulting mixture is determined primarily by the work-up of the mixture resulting after one or more rearrangement stages, at one or more different temperatures.

Particularly preferred reactive components are selected from the group encompassing monosilane $SiH_4$, oligomeric or polymeric silanes, especially linear silanes of the general formula $Si_nH_{n+2}$, where $n$ may comprise an integer in the 2 to 10 range, and also cyclic silanes of the general formula —$[SiH_2]_n$—, where $n$ may comprise an integer in the 3 to 10 range, trichlorosilane $HSiCl_3$, dichlorosilane $H_2SiCl_2$, and chlorosilane $H_3SiCl$, which may be employed alone or else as mixtures; employed very preferably are $SiH_4$, $HSiCl_3$, and $H_2SiCl_2$, alone or in a mixture.

Furthermore, additionally, the reactive components from Phase 2.3 and/or 2.4 may also comprise other reactive constituents, such as dopants based, for example, on compounds containing boron, nitrogen, phosphorus, arsenic, germanium, iron or else nickel. The dopants are preferably selected from the group encompassing ammonia $NH_3$, diborane $B_2H_6$, phosphane $PH_3$, germane $GeH_4$, arsane $AsH_3$, iron pentacarbonyl $Fe(CO)_4$ and nickel tetracarbonyl $Ni(CO)_4$.

Further reactive constituents which may be present in the reactive component include hydrogen or else hydrocarbons, selected from the group containing aliphatic hydrocarbons having 1 to 10 carbon atoms, preferably 1 to 6 carbon atoms, such as, for example, methane, ethane, propane, butane, pentane, isobutane, hexane, cyclopropane, cyclobutane, cyclopentane, cyclohexane, cycloheptane; unsaturated hydrocarbons having 1 to 10 carbon atoms such as, for example, ethene, acetylene, propene or butene, isoprene, butadiene, divinylbenzene, vinylacetylene, cyclohexadiene, cyclooctadiene, cyclic unsaturated hydrocarbons, such as, for example, cyclopropene, cyclobutene, cyclopentene, cyclohexene, cyclohexadiene, cyclopentadiene, dicyclopentadiene or norbornadiene, aromatic hydrocarbons, such as, for example, benzene, toluene, p-, m-, o-xylene, styrene (vinylbenzene), ethylbenzene, diphenylmethane or naphthalene, other aromatic hydrocarbons, such as, for example, phenol, o-, m-, p-cresol, cymene, nitrobenzene, chlorobenzene, pyridine, anthracene or phenanthrene, myrcene, geraniol, thioterpineol, norbornane, borneol, isoborneol, bornane, camphor, limonene, terpinene, pinene, pinane, carene, phenol, aniline, anisole, furan, furfural, furfuryl alcohol, hydroxymethylfurfural, bishydroxymethylfuran, and mixed fractions comprising a multiplicity of such compounds, such as, for example, those from natural gas condensates, crude oil distillates or coking oven condensates, mixed fractions from the product streams from a fluid catalytic cracker (FCC), steam cracker or a Fischer-Tropsch synthesis plant, or, very generally, hydrocarbon-containing material streams from the processing of wood, natural gas, crude oil, and coal.

Phases 2.1, 2.2, 2.3 and 2.4 may be but need not be performed in the order of their numbering. They may also be carried out repeatedly in succession in any desired order.

In Phase 3.1, in other words generally after the reactor B has been charged with the reactive component in Phase 2.4, the reactor B is heated until the target temperature is reached. At the target temperature, decomposition of the silicon precursor begins, with deposition of silicon in pores and on the surface of the porous particles. The beginning of the decomposition of silicon precursors with deposition of silicon may be ascertained experimentally by an increase in pressure in reactor B that is not brought about by an increase in temperature in reactor B. In the case of the decomposition of silicon precursors, gaseous molecules are generally formed as well as silicon under reaction conditions, and bring about an increase in the pressure in reactor B. The volume of reactor B remains generally constant during the implementation of the process.

Preferably, in Phase 3.1, the pressure change dp on heating of the closed reactor B having the volume V is dependent essentially on the temperature change dT, as may be described, for example, by the thermodynamic state equation in accordance with equation 1:

$$dp_{Phase3} = \left(\frac{\partial p}{\partial T}\right)_{V,n} dT \qquad (1)$$

After attainment of the target temperature for the decomposition of the silicon precursor in Phase 3.2, the temperature in Phase 4.1 in reactor B may in relation to the target temperature of Phase 3.1 be—for example—raised, kept constant, or lowered to a small extent.

The temperature, the pressure, or differential pressure measurements in reactor B in all the phases may be determined using techniques and apparatuses for measurement that are common for reactors. Following customary calibration, different measuring apparatuses produce the same results.

The target temperature is situated preferably in the range from 250 to 1000° C., more preferably 300 to 800° C., and most preferably 300 to 550° C. For $SiH_4$, for example, the target temperatures are preferably between 30° and 500° C., more preferably in the range from 320 to 450° C. and very preferably in the range from 320 to 420° C. The target temperatures for $HSiCl_3$ are preferably between 38° and 1000° C., more preferably in the 420 to 600° C. range. The target temperatures for $H_2SiCl_2$ are preferably between 35° and 800° C., more preferably in the 380 to 500° C. range.

In the case where hydrocarbons containing no silicon precursor are used as further reactive components in Phase 2.3, the target temperatures applied in Phase 3.2 and/or additionally for the silicon deposition during Phase 4.1 and 4.2 are temperatures at which the decomposition of the hydrocarbons begins and carbon is deposited in pores and on the surface of the porous particles. In this embodiment the target temperatures selected are preferably in the range from 250 to 1000° C., more preferably from 350 to 850° C., and most preferably from 400 to 650° C.

In the process of the invention the pressure in reactor B during Phases 4.1 and 4.2 increases to at least 7 bar.

In one preferred embodiment, the progress of reaction in the course of the process is monitored on the basis of pressure changes. In this way it is possible, for example, to ascertain the degree of infiltration or the end of infiltration. Infiltration refers to the deposition of silicon in pores and on the surface of the porous particles in Phase 4.1 and 4.2. The end of infiltration may be determined, for example, from the absence of any further pressure increase.

The pressure change dp in reactor B having the volume V during Phases 4.1 and 4.2 arises generally substantially from the temperature change dT and/or amount-of-substance change $dn_i$ in the course of the deposition of silicon, as represented for example by equation 2:

$$dp_{Phase4} = \left(\frac{\partial p}{\partial T}\right)_{V,n_i} dT + \sum_{i,i\neq j} \left(\frac{\partial p}{\partial n_i}\right)_{V,T,n_j} dn_i \tag{2}$$

The pressure change in Phases 4.1 and 4.2 is preferably a product substantially of the amount-of-substance change in the course of the deposition of silicon. Advantageously, therefore, the end of the reaction of the silicon precursors can be recognized from the absence of any further pressure increase at the end of Phases 4.1 and 4.2, and so the further phases can be effectively triggered in terms of time without the unnecessary removal of unreacted silicon precursors from the reactor, with a complete conversion being achieved.

In one variant of the process in Phases 4.1 and 4.2 the temperature is not maintained or increased by external heating. The temperature in Phases 4.1 and 4.2 comes about preferably as a result of the heat resulting from the possibly exothermic decomposition of the silicon precursors. Additionally preferred is a slight temperature drop in Phases 4.1 and 4.2, more preferably of at maximum 20° C. during Phases 4.1 and 4.2.

The pressure increase dp in reactor B in Phase 4.1 and 4.2 (decomposition of the silicon precursor) is preferably higher than in Phase 3.1 (heating of the pressure-rated reactor), this being represented, for example, by equation 3a or 3b:

$$dp_{Phase4} > dp_{Phase3}, \tag{3a}$$

or $$\left[\left(\frac{\partial p}{\partial T}\right)_{V,n_i} dT + \sum_{i,i\neq j} \left(\frac{\partial p}{\partial n_i}\right)_{V,T,n_j} dn_i\right]_{Phase4} > \left[\left(\frac{\partial p}{\partial T}\right)_{V,n} dT\right]_{Phase3}. \tag{3b}$$

In Phase 4.1 and 4.2, the pressure in reactor B preferably reaches at least 10 bar, more preferably at least 50 bar, and more preferably at least 100 bar. The pressure in reactor B in Phase 4.1 and 4.2 preferably remains below 400 bar, more preferably below 300 bar, and especially preferably at below 200 bar.

The temperature prevailing in reactor B in Phase 4.1 and 4.2 is in the range from preferably 100 to 1000° C., more preferably in the range from 300 to 900° C., and most preferably in the range from 320 to 750° C.

The temperature, the pressure, pressure changes or differential pressure measurements in reactor B in Phase 4.1 and 4.2 may be determined using techniques and apparatuses for measurement that are common for pressure-rated reactors. Following customary calibration, different measuring apparatuses produce the same measuring results. Amounts of substance or amount-of-substance changes may be determined, for example, by withdrawing a sample of defined volume from the pressure-rated reactor and determining its substantive composition in a conventional way by means of gas chromatography.

The heating of reactor B in Phase 3.1 and optionally in Phase 4.1 may take place, for example, at a constant heating rate or at a plurality of different heating rates. Heating rates may be adapted by the skilled person in each individual case according to the design of the process—according, for example, to the size of the reactor, to the amount of porous particles in the reactor, to the stirring technology, or to the planned reaction time. The entire reactor B is preferably heated in Phase 3.1 quickly such that in spite of the rapid heating, the maximum temperature gradient in reactor B at a temperature at which the decomposition of the silicon precursor begins remains below 1000° C./m, more preferably below 100° C./m, and very preferably below 10° C./m. In this way it is possible, for example, to ensure that the predominant portion of the silicon is deposited in the pores of the porous particles and not on their outer surfaces.

The temperature at which the decomposition of the silicon precursor begins may depend, for example, on the porous particles used, on the silicon precursor or precursors used, and on the other boundary conditions of the decomposition, such as, for example, the partial pressure of the silicon precursor at the moment of the decomposition, and the presence of other reactive components, such as catalysts, for example, which influence the decomposition reaction.

The heating of reactor B in Phase 3.1 takes place preferably at heating rates of 1 to 100° C. per minute, more preferably at heating rates of 2 to 50° C. per minute, and very preferably at a heating rate of 3 to 10° C. per minute.

During the decomposition of the silicon precursors in Phase 4.1 and 4.2, the temperature may be kept constant or else varied. The objective is the largely complete conversion of the silicon precursors in as short a time as possible, with generation of a silicon-containing material suitable for use.

In order to control the rate of the pressure increase in the various phases of the operation, there are a variety of technical solutions that can be used. In order to increase or reduce the pressure increase, the heat supplied to the reactor contents is preferably increased or reduced, respectively. In order to reduce the rate of pressure increase, it is preferable also to increase the removal of heat from reactor B and C by cooling; for this purpose, preferably one or more reactor walls are cooled or facilities are introduced into the reactor for the removal of heat, examples being cooling pipes or cooling ribs. In order to control the pressure in the reactor very quickly, preference is given to supplying or removing small amounts of gas from reactor B or C, or supplying evaporating liquids. In this context, the substream removed from reactor B or C, after cooling and/or removal of a portion of the overall stream, is preferably returned again wholly or partly into the reactor contents in a closed circuit.

The course of the reaction in Phases 4.1 and 4.2 is preferably monitored analytically, in order to recognize the end of the reaction and so to minimize the reactor occupancy time. Methods for observing the course of the reaction include, for example, temperature measurement for determining exothermic or endothermic events, pressure measurements for determining the course of the reaction through changing ratios of solid to gaseous reactor content constituents, and also further techniques which enable observation of the changing composition of the gas space during the reaction.

Preference is given to monitoring the change in the pressure, especially the increase in the pressure, in reactor B during the implementation of the process. The increase is an indicator of the deposition rate and therefore a pointer to the remaining surface area in the porous particles and/or in the resultant silicon-containing material.

In another preferred variant of the process, a technical component is used which enables the separation of hydrogen and silane. This separation may be performed, for example, via filtration and/or membrane techniques (solution-diffusion model and hydrodynamic model), adsorption, chemisorption, absorption or chemisorption or molecular sieves (e.g. zeolite).

This component makes it possible, in the case of hydrogen as gaseous reaction product, for Phase 2.4 to be able to be extended continuously until the desired amount of silicon has been deposited. Phase 6.1 as well is extended continuously in parallel.

In another preferred variant of the process, reactor B is equipped with a technical facility serving for removing occurring, condensable or resublimable byproducts. In one particularly preferred variant in this context, silicon tetrachloride is condensed and is removed separately from the silicon-containing material.

In Phase 5.1 the pressure in reactor B is adjusted by letting off the prevailing pressure, evacuating and/or charging with a further gas, preference being given to inert gases, such as, for example, hydrogen, helium, neon, argon, krypton, xenon, nitrogen, carbon dioxide or steam, individually or as mixtures; hydrogen is especially preferred.

In Phase 5.2, reactor B is adjusted to a defined temperature or a defined temperature profile is run. After the end of the deposition, preferably, cooling takes place optionally to a target temperature, preferably to the temperature for a further Phase 2.3 and/or 2.4.

The order of 5.1 and 5.2 can be selected arbitrarily. Phases 5.1 and 5.2 may overlap temporally in their operation.

In Phase 6.1, the gaseous byproducts of the reaction, formed in the course of the deposition, are removed preferably at the temperature of the deposition or after attainment of the temperature desired for the removal of the gaseous reaction byproducts from the gas space of reactor B, by purging, for example. The use of a purge gas is preferred. Before being charged with the purged gas, the reactor B is preferably evacuated at least once. Preferred purge gases are inert gases, such as, for example, hydrogen, helium, neon, argon, krypton, xenon, nitrogen, carbon dioxide or steam, individually or as mixtures, or mixtures thereof with oxygen are used, such as air or lean air. The water content of the gas mixture may be adjusted here. In Phase 6.2 the particles obtained from reactor B are then transferred either into a reactor C or into a suitable reservoir vessel. Where the particles have been transferred into a reservoir vessel, the particles can be transferred directly on that vessel into reactor C. The transfer in Phase 6.2 may be accomplished, for example, by a drop tube, continuous conveyor, flow conveyor/suction or pressure conveying unit (e.g. vacuum conveyor, transport blower); mechanical conveyors (e.g. roller conveyors with drive, screw conveyors, circular conveyors, circulation conveyors, bucket unit, star wheel locks, chain conveyors, scraper conveyors, belt conveyors, oscillation conveyors); gravity conveyors (e.g. chutes, roller bed, ball bed, rail bed), and also by means of non-continuous conveyors, floor-based and rail-free (e.g. automated vehicle, manual forklift truck, electric forklift truck, driverless transport systems (DTS), air-cushion vehicle, hand cart, electric cart, motor vehicle (tractor, wagon, forklift stacker), transfer carriage, transfer/lift carriage, shelf access device (with/without converter, able to follow curved paths); floor-based, rail-bound (e.g. plant railway, track vehicle; floor-free (e.g. trolley track, crane (e.g. bridge crane, portal crane, jib crane, tower crane), electric overhead track, small-vessel transport system; fixed (e.g. elevator, service lift and cherry picker, stepwise conveyor).

In Phase 7.1 of the process, the silicon-containing particles in reactor C may be aftertreated and/or deactivated. This is preferably done by purging reactor C with oxygen, more particularly with a mixture of inert gas and oxygen. In this way it is possible, for example, to modify and/or deactivate the surface of the silicon-containing material. It is possible for example to achieve a reaction of any reactive groups present on the surface of the silicon-containing material. For this purpose a mixture of nitrogen and oxygen and optionally alcohols and/or water is preferably used which contains preferably at most 20 vol %, more preferably at most 10 vol % and especially preferably at most 5 vol % of oxygen, and also preferably at most 100 vol %, more preferably at most 10 vol % and especially preferably at most 1 vol % of water. This step takes place preferably at temperatures of at most 200° C., more preferably at most 100° C. and especially preferably at most 50° C. The particle surfaces may also be deactivated with a gas mixture comprising inert gas and alcohols. Used with preference here are nitrogen and isopropanol. It is, though, also possible to use methanol, ethanol, butanols, pentanols or longer-chain and branched alcohols and diols.

The particles may also be deactivated by dispersion in a liquid solvent or a solvent mixture. This mixture may comprise, for example, isopropanol or an aqueous solution. The deactivation of the particles in Phase 7.1 may optionally also be accomplished by a coating using C-, Al- and/or B-containing precursors at temperatures of 200-800° C. with optionally subsequent treatment in an oxygen-containing atmosphere.

Aluminium-containing precursors used may be, for example, trimethylaluminium ($(CH_3)_3Al$), aluminium 2,2,6,6-tetramethyl-3,5-heptanedionate ($Al(OCC(CH_3)_3CHCOC(CH_3)_3)_3$), tris(dimethylamido)aluminium ($Al(N(CH_3)_2)_3$) and aluminium triisopropoxide ($C_9H_{21}AlO_3$).

Boron-containing precursors used may be, for example, borane ($BH_3$), triisopropyl borate ($[(CH_3)_2CHO]_3B$), triphenylborane ($(C_6H_5)_3B$) and tris(pentafluorophenyl)borane $(C_6F_5)_3B$.

In Phase 7.1 it is, however, also possible to introduce, for example, aftercoatings of the particles with solid-state electrolytes via CVI depositions from, for example, tert-butyllithium and trimethyl phosphate.

In Phase 7.2 of the process, in principle, the silicon-containing materials are withdrawn from reactor C, optionally with retention of an inert gas atmosphere present in reactor C. This may be accomplished, for example, via the following discharge methods: pneumatically (by means of superatmospheric or subatmospheric pressure); mechanically (star wheel lock, plate discharge, discharge screw or stirring element in the reactor, belt discharge) or gravimetrically (double flap or double ball valve, optionally with vibration assistance).

In another preferred embodiment of the process, Phases 2.1 to 5.2 are repeated one or more times.

In one preferred embodiment of the process, Phases 2.1 to 5.2 are repeated multiply, in which case the silicon precursor respectively charged in Phase 2.4 may be the same or different in each case, with mixtures of two or more silicon precursors also being possible. Similarly, the reactive component charge in 2.3 may be the same or different in each case or may consist of mixtures of different reactive components. Following the multiple repetition of the individual Phases 2.1 to 5.2, the procedure in reactor B is ended with Phase 6. The sequence and the implementation of Phases 2.1 to 6.1 may be varied by the skilled person. In this context, individual phases may be omitted.

In another preferred embodiment of the process, Phase 6.1 follows Phase 4.2 directly; in other words, Phase 5 can be omitted; in other words, after Phase 4.2, it is also possible to continue with Phase 6.1 without cooling the reactor B.

In a further preferred embodiment, Phases 2.1 to 6.1, optionally with omission of Phase 5, are single or multiply repeated (reaction cycle), in which case, in individual or multiple repetitions, it is also possible to employ silicon-free reactive components in the sense of Phase 2.3, in which case the silicon-free reactive components in the respective repetitions may be the same or different. Silicon-free reactive components preferably contain no silicon precursor. Silicon-free reactive components preferably comprise one or more hydrocarbons. In this preferred embodiment, the silicon-free reactive component may be used in a repetition of Phases 2.1 to 6.1, for example before or after the deposition of silicon or else between two depositions of silicon. Preferred silicon-free reactive components are hydrocarbons. When using silicon-free reactive components, carbon is preferably deposited in pores and on the surface of the porous particles or of the silicon-containing materials.

In one particularly preferred embodiment, in a first reaction cycle, in Phase 2.4, a reactive component comprising at least one silicon precursor is charged, and in the second reaction cycle, in Phase 2.3, a reactive component comprising at least one hydrocarbon is charged, this latter component preferably being silicon-free; optionally, Phase 5 is omitted. By this means it is possible, for example, to obtain a silicon-containing material which has no outwardly directed free silicon surface. The order of 2.3 and 2.4 is variable.

Optionally, in a third reaction cycle, in Phase 2.3, a further hydrocarbon-containing silicon-free reactive component is used, with optional omission of Phase 5. Becoming obtainable as a result, for example, is a silicon-containing material which has a carbon layer between the porous particles and the deposited silicon and which optionally additionally carries an outer carbon layer, meaning that there is no outwardly directed free silicon surface present.

Preferred silicon-free reactive components are one or more hydrocarbons. Through thermal decomposition of the hydrocarbons it is possible in general to deposit carbon in pores and on the surface of the porous particles. Examples of hydrocarbons are aliphatic hydrocarbons having 1 to 10 carbon atoms, especially 1 to 6 carbon atoms, preferably methane, ethane, propane, butane, pentane, isobutane, hexane, cyclopropane, cyclobutane, cyclopentane, cyclohexane and cycloheptane; unsaturated hydrocarbons having 1 to 10 carbon atoms, such as, for example, ethene, acetylene, propene or butene, isoprene, butadiene, divinylbenzene, vinylacetylene, cyclohexadiene, cyclooctadiene, cyclic unsaturated hydrocarbons, such as, for example, cyclopropene, cyclobutene, cyclopentene, cyclohexene, cyclohexadiene, cyclopentadiene, dicyclopentadiene or norbornadiene, aromatic hydrocarbons, such as, for example, benzene, toluene, p-, m-, o-xylene, styrene (vinylbenzene), ethylbenzene, diphenylmethane or naphthalene, other aromatic hydrocarbons, such as, for example, phenol, o-, m-, p-cresol, cymene, nitrobenzene, chlorobenzene, pyridine, anthracene or phenanthrene, myrcene, geraniol, thioterpineol, norbornane, borneol, isoborneol, bornane, camphor, limonene, terpinene, pinene, pinane, carene, phenol, aniline, anisole, furan, furfural, furfuryl alcohol, hydroxymethylfurfural, bishydroxymethylfuran, and mixed fractions comprising a multiplicity of such compounds, such as, for example, those from natural gas condensates, crude oil distillates or coking oven condensates, mixed fractions from the product streams from a fluid catalytic cracker (FCC), steam cracker or a Fischer-Tropsch synthesis plant, or, very generally, hydrocarbon-containing substance streams from the processing of wood, natural gas, crude oil, and coal.

The silicon-free reactive components, namely the reactive components which comprise one or more hydrocarbons but no silicon precursor, preferably contain no further component or one or more inert gases and/or one or more reactive constituents, such as hydrogen, for example, and/or one or more dopants. Dopants are, for example, compounds containing boron, nitrogen, phosphorus, arsenic, germanium, iron or nickel. The dopants are preferably selected from the group encompassing ammonia $NH_3$, diborane $B_2H_6$, phosphane $PH_3$, germane $GeH_4$, arsane $AsH_3$, and nickel tetracarbonyl $Ni(CO)_4$.

A temperature-conditionable reactor is, generally, a reactor which can be operated in a manner such that the temperature inside the reactor can be established, for example, in the range between −40 and 1000° C. Smaller temperature ranges are possible.

A vacuum-rated reactor is, generally, a reactor which can be operated in a manner such that the pressure inside the reactor is less than/equal to the surrounding pressure of the reactor.

A pressure-rated reactor is, generally, a reactor which can be operated in a manner such that the pressure inside the reactor is greater than/equal to the surrounding pressure of the reactor.

A reactor may at the same time be temperature-conditionable, pressure-rated and vacuum-rated; all combinations are possible. Alternatively, a reactor may also fulfil in each case only one of the above-specified features.

The minimum requirements for the reactors used are as follows:

Reactor A: temperature-conditionable and vacuum-rated
Reactor B: temperature-conditionable and pressure-rated
Reactor C: temperature-conditionable Technical optional features for the individual reactors for specific variants of the invention:

Reactor A:

- System for preheating, drying and inertizing the porous particles.
- A system may be connected for specific addition/metering of the porous particles (for technical description see Phase 1.1).
- For drying and/or removal of impurities in the porous particles, a system may be connected which enables the removal of condensable or resublimable substances.
- A system may be connected which allows the porous particles to be transferred into the reactor B (for technical description see Phase 1.3)

Reactor B:

- System for air cooling.
- To increase the volume, a further pressure-rated vessel may be connected, which allows higher reactive component amounts in the individual reaction cycle. This vessel may be heated or not. Pressure equalization between the vessel and reactor B may be passive (diffusion) or active (promoted by technical means).
- For operational simplification, a hydrogen separator may be connected (for technical description see Phase 3.1).
- For the removal of condensable or resublimable byproducts in the gaseous reaction products, a vessel may be connected which allows the byproducts to be removed by condensation or resublimation.
- A system may be connected by which the material can be transferred into the reactor C or a reservoir vessel (for technical description see Phase 1.3).

Reactor C

- System for removing condensable or resublimable byproducts. A vessel may be connected which allows the byproducts to be removed by condensation or resublimation.

A cascade reactor system for the purposes of the application is the linking of at least 2 reactors. There is no upper limit on the number of reactors. The number of reactors A, B and C relative to one another, and also their sizes, shape, material and configurations, may differ. The skilled person is able to tailor the amounts of reactors and their sizes to one another in order overall to make the output of the cascade reactor system as efficient as possible. The reactors may be connected directly to one another or may be locally separate from one another, in which case charging takes place by means of movable reservoir vessels. It is also conceivable for two or more reactors B to be connected with one another and for each reaction step to take place in an extra reactor B.

In two particular embodiments of the process, the cascade reactor consists of only two mutually dependent reactors. In the first embodiment, Phases 1 to 6.1 are carried out in the same reactor, with Phase 1.3 omitted in this case. In the second embodiment, Phases 2 to 7 are carried out in one reactor, with Phase 6.2 omitted in this case. In both cases the reactors may have different temperature zones.

The reactors for the purposes of this application are preferably types of reactor selected from the group encompassing tubular reactors, retort ovens, fluidized bed reactors, fixed bed reactors and autoclaves. Employed with particular preference are fluidized bed reactors and autoclaves, especially preferably autoclaves.

During the operation, the porous particles and also the resultant silicon-containing material may generally take the form of a stationary bed or may be in agitated form with mixing. An agitated mixing of the porous particles or of the resultant silicon-containing material in reactor A, B and C is preferred. It allows, for example, homogeneous contact of all the porous particles with reactive components, or a homogeneous temperature distribution in the bed. The particles may be agitated, for example, by stirring internals in the reactor, by the movement of the reactor as a whole, or else by fluidization of the solids in the reactor with a gas flow.

Types of reactor which can be used for a stationary bed without mixing are embodiments of any desired geometry. Preferred forms of reactor construction are cylindrical, conical, spherical and polyhedral forms or combinations thereof.

In order to mix together a bed in reactor A, B and C, preference is given to all forms of reactor construction in which beds of solids can be agitated. These are, for example, moving reactors, reactors with moving stirring elements, or gas-traversed reactors, or combinations thereof.

The form of movement in moving reactors is preferably a rotational movement. Other forms of movement are likewise suitable. Preferred forms of construction for rotating reactors are, for example, drum reactors or tubular reactors, conical reactors, double-cone reactors, reactors with offset cones, spherical reactors, polyhedral reactors, V-shaped reactors, double-V-shaped reactors, or geometric combinations thereof. In the case of symmetrical forms of construction, the axis of rotation lies preferably in the axis of symmetry of the reactor. In the case of nonsymmetric forms of construction, the axis of rotation passes preferably through the centre of gravity of the reactor. In another preferred embodiment, the axis of rotation is selected such that a tumbling movement is developed. The mixing events within the moving reactor are preferably boosted by internals. Typical internals are guide plates, blades, vanes, and ploughshares. In accordance with the invention, the orientation of the axis of rotation is freely selectable here. Axes of rotation are preferably oriented vertically, horizontally or at a free angle in relation to the horizontal embodiment. A further preferred form of construction for the mixing together of beds are fixed reactors A, B and C with moving stirring elements. Preferred geometries for this are cylindrical reactors, conical reactors, spherical, polyhedral reactors, or combinations thereof. The movement of the stirring element is preferably a rotational movement. Other forms of movement are likewise suitable. The stirring element is driven preferably via a stirring shaft, and there may be one stirring element or a plurality of stirring elements present per stirring shaft. Incorporated in reactors A, B and C are preferably a plurality of stirring shafts, on each of which there may be one stirring element or a plurality of stirring elements. The main reactor axis is preferably aligned horizontally or vertically. In a further preferred embodiment, the stirring shafts are installed horizontally or vertically in a reactor of arbitrary orientation. For reactors A, B and C operated vertically, preferred forms of construction are those in which, for example, a stirring element or a plurality of stirring elements commix the bed material through a rotational movement by way of a main stirring shaft. Preference is given additionally to forms of construction in which two or more stirring shafts run in parallel. There are also preferred forms of construction in which two or more stirring shafts are operated not parallel to one another. Another preferred form of construction for a vertically operated reactor A, B or C is characterized by the use of a screw conveyor. The screw conveyor conveys the bed material preferably centrally. A further design in accordance with the invention is the screw conveyor rotating along at the edge of the reactor. For reactors A, B or C operated horizontally, preferred forms of construction are those in which, for example, a stirring element or a plurality of stirring elements commix the bed material by a rotational movement by way of a main stirring shaft. Also possible are forms of construction wherein two or more stirring shafts run in parallel. Additionally preferred are forms of construction in which two or more stirring shafts are not operated in parallel to one another. For vertically operated reactors A, B or C, preferred stirring elements are elements selected from the group containing helical stirrers, spiral stirrers, anchor stirrers or, generally, stirring elements which convey the bed material axially or radially, or both axially and radially. In the case of horizontally operated reactors A, B or C, there are preferably a plurality of stirring elements on one shaft. Forms of construction in accordance with the invention for the stirring elements of horizontally operated reactors are ploughshare, paddle, blade stirrer, spiral stirrer or, generally, stirring elements which convey the bed material both axially and radially. Besides the moving stirring elements, preference is also given, for the fixed reactor A, B or C with moving stirring elements, to rigid internals, such as guide plates. Also preferred, in particular, are forms of construction in which both the reactor and a stirring element rotate.

As a further possibility for the commixing, beds of material are subjected preferably to gas streams. Particularly preferred here are forms of construction such as fluidized bed reactors. Further preferred are reactors A, B or C in which mixing zones are deliberately brought about in the reactor through the use of pneumatics.

For the construction of reactor A, B or C for implementing the process of the invention, any material is in principle suitable if under the respective operating conditions it has the necessary mechanical strength and chemical resistance. In terms of the chemical resistance, the reactor A, B or C may consist of corresponding solid materials as well as of chemically unresistive materials (pressure-bearing) which have specific coatings or platings on parts that are in media contact.

These materials are selected, in accordance with the invention, from the group containing:

- metallic materials which correspond (according to DIN CEN ISO/TR 15608) for steels to material groups 1 to 11, for nickel and nickel alloys to groups 31 to 38, for titanium and titanium alloys to groups 51 to 54, for zirconium and zirconium alloys to groups 61 and 62, and for cast iron to groups 71 to 76,
- ceramic materials comprising oxide ceramics in the single-substance system, such as, for example, aluminium oxide, magnesium oxide, zirconium oxide, titanium dioxide (capacitor material), and also multi-substance systems, such as, for example, aluminium titanate (mixed form of aluminium oxide and titanium oxide), mullite (mixed form of aluminium oxide and silicon oxide), lead zirconate titanate (piezoceramic), or dispersion ceramics such as aluminium oxide strengthened with zirconium oxide (ZTA—zirconia toughened aluminium oxide)—$Al_2O_3/ZrO_2$),
- non-oxide ceramics, such as, for example carbides, examples being silicon carbide and boron carbide, nitrides, examples being silicon nitride, aluminium nitride, boron nitride and titanium nitride, borides and silicides, and also mixtures thereof, and
- composite materials belonging to the groups of the particulate composite materials, such as, for example, cemented carbide, ceramic composites, concrete and polymer concrete, the fibre composite materials, such as, for example, glass fibre-reinforced glass, metal matrix composites (MMC), fibre cement, carbon fibre-reinforced silicon carbide, self-reinforced thermoplastics, steel-reinforced concrete, fibre-reinforced concrete, fibre-plastics composites, such as, for example, carbon fibre-reinforced plastic (CRP), glass fibre-reinforced plastic (GRP) and aramid fibre-reinforced plastic (ARP), fibre-ceramic composites (ceramic matrix composites (CMC)), the penetration composite materials, such as, for example, metal matrix composites (MMC), dispersion-strengthened aluminium alloys or dispersion-hardened nickel-chromium superalloys, the layered composite materials, such as, for example, bimetals, titanium-graphite composite, composite plates and composite tubes, glass fibre-reinforced aluminium and sandwich constructions, and the structural composite materials.

The process of the invention for producing silicon-containing materials offers a variety of decisive advantages relative to the prior art. A particular advantage is the possibility for complete conversion of the silicon precursor in a short reaction time, assisted for example by the not solely temperature-related pressure increase occurring during Phase 4. Another advantage is the possibility of reducing the amount of inert gas or of avoiding it entirely, which likewise leads to higher space/time yields and therefore enables a more rapid and uniform deposition of the desired layers on the substrates. Furthermore, it is possible to prevent the continuous recycling or processing of the reactor offgas, as usually arises in the operation of an open reactor. In addition, the described implementation in a sealable reactor makes it easy to carry out multiple depositions from the same reactive component or else from different reactive components with a precisely adjustable amount of deposition product, based on the reactant in the respective deposition step. The silicon-containing materials obtained from the process of the invention are therefore also distinguished by the advantageous homogeneity of the layers deposited. As a result of the advantages of the process of the invention, silicon-containing materials are advantageously accessible rapidly and economically, particularly for use as an active material for anodes of lithium-ion batteries with outstanding properties. A particular advantage, moreover, is that the dusting often described can be avoided. This can be achieved, for example, by the large surface area of the porous particles, which is made available for the deposition of silicon from the silicon precursor, and also by the intense penetration of the porous particles with the silicon precursors. At the same time, a high yield of deposited silicon is obtained in this way. In contrast to a variant in which all of the reaction steps are carried out in the same reactor (see counter-example 2), the cascade reactor affords the following advantages:

- Energy savings through reduction in cooling and heating operations with a large temperature difference.
- Saving of capital costs through precision design of the respective reactors for the requirements of the particular operating step.
- High level of modularity offers broad opportunities for adaptation to varying quantity requirements and operating parameters.
- Possibility for combination of different reactors A, B and C in different sizes and numbers reduces the risk of complete failure and creates plannability for necessary modification downtime.
- Modular construction enables the implementation of minor maintenance work on one reactor while the other reactors are still in operation.

The porous particles for the process of the invention are preferably selected from the group containing amorphous carbon in the form of hard carbon, soft carbon, mesocarbon microbeads, natural graphite or synthetic graphite, single-wall and multiwall carbon nanotubes and graphene, oxides, such as silicon dioxide, aluminium oxide, mixed silicon-aluminium oxides, magnesium oxide, lead oxides and zirconium oxide, carbides such as silicon carbides and boron carbides, nitrides such as silicon nitrides and boron nitrides; and other ceramic materials, as may be described by the following component formula:

- $Al_aB_bC_cMg_dN_eO_fSi_g$ with 0 £a, b, c, d, e, f, g≤1, with at least two coefficients a to g>0 and a*3+b*3+c*4+d*2+g*4$^3$e*3+f*2.

The ceramic materials may for example be binary, ternary, quaternary, quinary, senary or septenary compounds. Preferred ceramic materials are those having the following component formulas:

- nonstoichiometric boron nitrides $BN_z$ with z=0.2 to 1,
- nonstoichiometric carbon nitrides $CN_z$ with z=0.1 to 4/3,
- boron carbonitrides $B_xCN_z$ with x=0.1 to 20 and z=0.1 to 20, where x*3+4$^3$ z*3,
- boron nitridoxides $BN_zO_r$ with z=0.1 to 1 and r=0.1 to 1, where 3$^3$ r*2+z*3,
- boron carbonitride oxides $B_xCN_zO_r$ with x=0.1 to 2, z=0.1 to 1 and r=0.1 to 1, where: x*3+4$^3$ r*2+z*3,
- silicon carboxides $Si_xCO_z$ with x=0.1 to 2 and z=0.1 to 2, where x*4+4$^3$ z*2,
- silicon carbonitrides $Si_xCN_z$ with x=0.1 to 3 and z=0.1 to 4, where x*4+4$^3$ z*3,
- silicon borocarbonitrides $Si_wB_xCN_z$ with w=0.1 to 3, x=0.1 to 2 and z=0.1 to 4, where w*4+x*3+4$^3$ z*3,
- silicon borocarboxides $Si_wB_xCO_z$ with w=0.10 to 3, x=0.1 to 2 and z=0.1 to 4, where w*4+x*3+4$^3$ z*2,
- silicon borocarbonitridooxides $Si_vB_wCN_xO_z$ with v=0.1 to 3, w=0.1 to 2, x=0.1 to 4 and z=0.1 to 3, where v*4+w*3+4$^3$ x*3+z*2, and aluminium borosilicocarbonitridooxides $Al_uB_vSi_xCN_wO_z$ with u=0.1 to 2, v=0.1 to 2,w=0.1 to 4, x=0.1 to 2 and z=0.1 to 3, where u*3+v*3+x*4+4^3w*3+z*2.

The porous particles preferably possess a density, determined by helium pycnometry, of 0.1 to 7 g/cm$^3$ and more preferably of 0.3 to 3 g/cm$^3$. This is advantageous for increasing the gravimetric capacity (mAh/cm$^3$) of lithium-ion batteries.

Preferred porous particles employed are amorphous carbons, silicon dioxide, boron nitride, silicon carbide and also silicon nitride, or else mixed materials based on these materials, with particular preference being given to the use of amorphous carbons, boron nitride and silicon dioxide.

The porous particles have a volume-weighted particle size distribution with diameter percentiles $d_{50}$ of preferably ≥0.5 μm, more preferably ≥1.5 μm and most preferably ≥2 μm. The diameter percentiles $d_{50}$ are preferably ≤20 μm, more preferably ≤12 μm and most preferably ≤8 μm.

The volume-weighted particle size distribution of the porous particles is preferably between the diameter percentiles $d_{10}$≥0.2 μm and $d_{90}$≤20.0 μm, more preferably between $d_{10}$≥0.4 μm and $d_{90}$≤15.0 μm, and most preferably between $d_{10}$≥0.6 μm to $d_{90}$≥12.0 μm.

The porous particles have a volume-weighted particle size distribution with diameter percentiles $d_{10}$ of preferably ≤10 μm, more preferably ≤5 μm, especially preferably ≤3 μm and most preferably ≤2 μm. The diameter percentiles $d_{10}$ are preferably ≥0.2 μm, more preferably ≥0.5 and most preferably ≥1 μm.

The porous particles have a volume-weighted particle size distribution with diameter percentiles $d_{90}$ of preferably ≥4 μm and more preferably ≥8 μm. The diameter percentiles $d_{90}$ are preferably ≤18 μm, more preferably ≤15 and most preferably ≤13 μm.

The volume-weighted particle size distribution of the porous particles has a span $d_{90}$-$d_{10}$ of preferably ≤15.0 μm, more preferably ≥12.0 μm, very preferably ≥10.0 μm, especially preferably ≤8.0 μm, and most preferably ≤4.0 μm.

The volume-weighted particle size distribution of the silicon-containing materials producible by the process of the invention has a span $d_{90}$-$d_{10}$ of preferably ≥0.6 μm, more preferably ≥0.8 μm and most preferably ≥1.0 μm.

The volume-weighted particle size distribution of the porous particles can be determined according to ISO 13320 by means of static laser scattering using the Mie model with the measuring instrument Horiba LA 950, with ethanol as dispersing medium for the porous particles.

The porous particles are preferably present in the form of particles. The particles may for example be isolated or agglomerated. The porous particles are preferably not aggregated and preferably not agglomerated. Aggregated means generally that in the course of the production of the porous particles, initially primary particles are formed and undergo fusion, and/or primary particles are linked to one another via covalent bonds, for example, and in this way form aggregates. Primary particles are generally isolated particles. Aggregates or isolated particles can form agglomerates. Agglomerates are a loose coalition of aggregates or primary particles, which are linked to one another for example via Van der Waals interactions or hydrogen bonds. Agglomerated aggregates can easily be split back into aggregates by conventional kneading and dispersing techniques. Aggregates cannot be disintegrated, or can be disintegrated only partly, into the primary particles by these techniques. The presence of the porous particles in the form of aggregates, agglomerates or isolated particles can be made visible, for example, by conventional scanning electron microscopy (SEM). Static light scattering methods for determining the particle size distributions or particle diameters of matrix particles are unable, in contrast, to distinguish between aggregates or agglomerates.

The porous particles may have any desired morphology, and may therefore, for example, be sputtery, platy, spherical or else acicular, with sputtery or spherical particles being preferred. The morphology can be characterized, for example, by the sphericity ψ or the sphericity S. According to the definition by Wadell, the sphericity ψ is the ratio of the surface area of a sphere of equal volume to the actual surface area of a body. In the case of a sphere, the value of ψ is 1. According to this definition, the porous particles for the process of the invention have a sphericity ψ of preferably 0.3 to 1.0, more preferably of 0.5 to 1.0 and most preferably of 0.65 to 1.0.

The sphericity S is the ratio of the circumference of an equivalent circle with the same area A as the projection of the particle projected onto a surface, to the measured circumference U of this projection: $S=2\sqrt{\pi A}/U$. In the case of a particle of ideal circularity, the value of S would be 1. For the porous particles for the process of the invention, the sphericity S is in the range from preferably 0.5 to 1.0 and more preferably from 0.65 to 1.0, based on the percentiles $S_{10}$ to $S_{90}$ of the numerical sphericity distribution. The sphericity S is measured, for example, from optical micrographs of individual particles or preferably, in the case of particles <10 μm, with a scanning electron microscope, by graphic evaluation by means of image analysis software, such as Image J, for example.

The porous particles preferably have a gas-accessible pore volume of ≥0.2 cm$^3$/g, more preferably ≥0.6 cm$^3$/g and most preferably ≥1.0 cm$^3$/g. This is useful for obtaining lithium-ion batteries with a high capacity. The gas-accessible pore volume was determined by gas sorption measurements with nitrogen in accordance with DIN 66134.

The porous particles are preferably open-pore. Open-pore means generally that pores are connected to the surface of particles, via channels, for example, and can preferably be in mass transfer, especially in transfer of gaseous compounds, with the surroundings. This can be verified using gas sorption measurements (evaluation according to Brunauer, Emmett and Teller, "BET"), i.e., of the specific surface area. The porous particles have specific surface areas of preferably ≥50 m$^2$/g, more preferably of 500 m$^2$/g and most preferably ≥1000 m$^2$/g. The BET surface area is determined according to DIN 66131 (with nitrogen).

The pores of the porous particles may have any desired diameters, i.e., generally, in the range of macropores (above 50 nm), mesopores (2-50 nm) and micropores (less than 2 nm). The porous particles can be used in any desired mixtures of different pore types. Preference is given to using porous particles having less than 30% of macropores, based on the total pore volume, more preferably porous particles without macropores, and very preferably porous particles with at least 50% of pores having a mean pore diameter of less than 5 nm. With very particular preference, the porous particles comprise exclusively pores having a pore diameter of less than 2 nm (method of determination: pore size distribution by BJH (gas adsorption) according to DIN 66134 in the mesopore range and according to Horvath-Kawazoe (gas adsorption) according to DIN 66135 in the micropore range; the evaluation of the pore size distribution in the macropore range is made by mercury porosimetry in accordance with DIN ISO 15901-1).

Preferred porous particles are those having a gas-inaccessible pore volume of less than 0.3 cm$^3$/g and more preferably less than 0.15 $cm^3/g$. In this way as well it is possible to increase the capacity of the lithium-ion batteries. The gas-inaccessible pore volume may be determined by means of the following formula:

$$\text{gas-inaccessible pore volume} = 1/\text{pure-material density} - 1/\text{skeletal density}.$$

The pure-material density here is a theoretical density of the porous particles, based on the phase composition or the density of the pure material (the density of the material as if it had no closed porosity). Data on pure-material densities can be found by the skilled person in, for example, the Ceramic Data Portal of the National Institute of Standards (NIST, https://srdata.nist.gov/CeramicDataPortal/scd). For example, the pure-material density of silicon oxide is 2.203 $g/cm^3$, that of boron nitride is 2.25 g $cm^3$, that of silicon nitride is 3.44 $g/cm^3$, and that of silicon carbide is 3.21 $g/cm^3$. The skeletal density is the actual density of the porous particles (gas-accessible) determined by helium pycnometry.

For clarification it may be noted that the porous particles are different from the silicon-containing material. The porous particles act as starting material for producing the silicon-containing material. Generally there is no silicon, more particularly no silicon obtained by deposition of silicon precursors, located in the pores of the porous particles and on the surface of the porous particles, preferably.

The silicon-containing material obtained by the process of the invention by means of deposition of silicon in pores and on the surface of the porous particles has a volume-weighted particle size distribution with diameter percentiles $d_{50}$ preferably in a range from 0.5 to 20 μm. The $d_{50}$ value is preferably at least 1.5 μm, and more preferably at least 2 μm. The diameter percentiles $d_{50}$ are preferably at most 13 μm and more preferably at most 8 μm.

The volume-weighted particle size distribution of the silicon-containing material is situated preferably between the diameter percentiles $d_{10} \geq 0.2$ μm and $d_{90} \leq 20.0$ μm, more preferably between $d_{10} \geq 0.4$ μm and $d_{90} \leq 15.0$ μm, and most preferably between $d_{10} \geq 0.6$ μm to $d_{90} \leq 12.0$ μm.

The silicon-containing material has a volume-weighted particle size distribution with diameter percentiles $d_{10}$ of preferably ≤10 μm, more preferably ≤5 μm, especially preferably ≤3 μm and most preferably ≤1 μm. The diameter percentiles $d_{10}$ are preferably ≥0.2 μm, more preferably ≥0.4 μm and most preferably ≥0.6 μm.

The silicon-containing material has a volume-weighted particle size distribution with diameter percentiles $d_{90}$ of preferably ≥5 μm and more preferably ≥10 μm. The diameter percentiles $d_{90}$ are preferably ≥20 μm, more preferably ≤15 μm and most preferably ≤12 μm.

The volume-weighted particle size distribution of the silicon-containing material has a span $d_{90}$-$d_{10}$ of preferably ≤15.0 μm, more preferably ≤12.0 μm, more preferably ≤10.0 μm, especially preferably ≤8.0 μm, and most preferably ≤4.0 μm. The volume-weighted particle size distribution of the silicon-containing material has a span $d_{90}$-$d_{10}$ of preferably ≥0.6 μm, more preferably ≥0.8 μm and most preferably ≥1.0 μm.

The particles of the silicon-containing material are preferably in the form of particles. The particles may be isolated or agglomerated. The silicon-containing material is preferably not aggregated and preferably not agglomerated. The terms isolated, agglomerated and unaggregated have already been defined earlier on above in relation to the porous particles. The presence of silicon-containing materials in the form of aggregates or agglomerates may be made visible, for example, by means of conventional scanning electron microscopy (SEM).

The silicon-containing material may have any desired morphology, and may therefore, for example, be sputtery, platy, spherical or else acicular, with sputtery or spherical particles being preferred.

According to the definition of Wadell, the sphericity ψ is the ratio of the surface area of a sphere of equal volume to the actual surface area of a body. In the case of a sphere, the value of ψ is 1. According to this definition, the silicon-containing materials accessible by the process of the invention have a sphericity ψ of preferably 0.3 to 1.0, more preferably of 0.5 to 1.0, and most preferably of 0.65 to 1.0.

The sphericity S is the ratio of the circumference of an equivalent circle with the same area A as the projection of the particle projected onto a surface, to the measured circumference U of this projection: $S=2\sqrt{\pi A}/U$. In the case of a particle of ideal circularity, the value of S would be 1. For the silicon-containing materials accessible by the process of the invention, the sphericity S is in the range from preferably 0.5 to 1.0 and more preferably from 0.65 to 1.0, based on the percentiles $S_{10}$ to $S_{90}$ of the numerical sphericity distribution. The sphericity S is measured, for example, from optical micrographs of individual particles or preferably, in the case of particles smaller than 10 μm, with a scanning electron microscope, by graphic evaluation by means of image analysis software, such as Image J, for example.

The cycling stability of lithium-ion batteries can be increased further via the morphology, the material composition, in particular the specific surface area or the internal porosity of the silicon-containing material.

The silicon-containing material contains preferably 10 to 90 wt %, more preferably 20 to 80 wt %, very preferably 30 to 60 wt % and especially preferably 40 to 50 wt % of porous particles, based on the total weight of the silicon-containing material.

The silicon-containing material contains preferably 10 to 90 wt %, more preferably 20 to 80 wt %, very preferably 30 to 60 wt % and especially preferably 40 to 50 wt % of silicon obtained via deposition from the silicon precursor, based on the total weight of the silicon-containing material (determination preferably by elemental analysis, such as ICP-OES).

If the porous particles comprise silicon compounds, in the form of silicon dioxide, for example, the above-mentioned wt % figures for the silicon obtained via deposition from the silicon precursor can be determined by subtracting the silicon mass in the porous particles, ascertained by elemental analysis, from the silicon mass in the silicon-containing material, ascertained by elemental analysis, and dividing the result by the mass of the silicon-containing material.

The volume of the silicon contained in the silicon-containing material and obtained via deposition from the silicon precursor is a product of the mass fraction of the silicon obtained via deposition from the silicon precursor, as a proportion of the total mass of the silicon-containing material, divided by the density of silicon (2.336 $g/cm^3$).

The pore volume P of the silicon-containing materials is a product of the sum of gas-accessible and gas-inaccessible pore volume. The Gurwitsch gas-accessible pore volume of the silicon-containing material can be determined by gas sorption measurements with nitrogen in accordance with DIN 66134.

The gas-inaccessible pore volume of the silicon-containing material can be determined using the formula:

Gas-inaccessible pore volume = 1/skeletal density − 1/pure-material density.

Here, the pure-material density of a silicon-containing material is a theoretical density which can be calculated from the sum of the theoretical pure-material densities of the components contained in the silicon-containing material, multiplied by their respective weight-based percentage fraction in the overall material. Accordingly, for example, for a silicon-containing material wherein silicon is deposited on a porous particle:

Pure-material density=theoretical pure-material density of the silicon*fraction of the silicon in wt %+theoretical pure-material density of the porous particles*fraction of the porous particles in wt %.

Data on pure-material densities can be taken by the skilled person from, for example, the Ceramic Data Portal of the National Institute of Standards (NIST, https://srdata.nist.gov/CeramicDataPortal/scd). For example, the pure-material density of silicon oxide is 2.203 g/cm$^3$, that of boron nitride is 2.25 g cm$^3$, that of silicon nitride is 3.44 g/cm$^3$, and that of silicon carbide is 3.21 g/cm$^3$.

The pore volume P of the silicon-containing materials is situated preferably in the range from 0 to 400 vol %, more preferably in the range from 100 to 350 vol % and especially preferably in the range from 200 to 350 vol %, based on the volume of the silicon contained in the silicon-containing material and obtained from the deposition of the silicon precursor.

The porosity contained in the silicon-containing material may be both gas-accessible and gas-inaccessible. The ratio of the volume of gas-accessible to gas-inaccessible porosity of the silicon-containing material may be situated generally in the range from 0 (no gas-accessible pores) to 1 (all pores are gas-accessible). The ratio of the volume of gas-accessible to gas-inaccessible porosity of the silicon-containing material is situated preferably in the range from 0 to 0.8, more preferably in the range from 0 to 0.3, and especially preferably from 0 to 0.1.

The pores of the silicon-containing material may have any desired diameters, being situated, for example, in the range of macropores (>50 nm), mesopores (2-50 nm) and micropores (<2 nm). The silicon-containing material may also contain any desired mixtures of different pore types. The silicon-containing material preferably contains at most 30% of macropores, based on the total pore volume, particular preference being given to a silicon-containing material without macropores, and very particular preference to a silicon-containing material having at least 50% of pores, based on the total pore volume, having a mean pore diameter of below 5 nm. With more particular preference the silicon-containing material exclusively has pores with a diameter of at most 2 nm.

The silicon-containing material comprises silicon structures which in at least one dimension have structure sizes of preferably at most 1000 nm, more preferably less than 100 nm, very preferably less than 5 nm (method of determination: scanning electron microscopy (SEM) and/or high-resolution transmission electron microscopy (HR-TEM)).

The silicon-containing material preferably comprises silicon layers having a layer thickness of below 1000 nm, more preferably less than 100 nm, very preferably less than 5 nm (method of determination: scanning electron microscopy (SEM) and/or high-resolution transmission electron microscopy (HR-TEM)). The silicon-containing material may also comprise silicon in the form of particles. The silicon particles have a diameter of preferably at most 1000 nm, more preferably less than 100 nm, very preferably less than 5 nm (method of determination: scanning electron microscopy (SEM) and/or high-resolution transmission electron microscopy (HR-TEM)). The figure for the silicon particles here is based preferably on the diameter of the circle around the particles in the microscope image.

The silicon-containing material preferably has a specific surface area of at most 100 m$^2$/g, more preferably less than 30 m$^2$/g, and especially preferably less than 10 m$^2$/g. The BET surface area is determined according to DIN 66131 (with nitrogen). Accordingly, when the silicon-containing material is used as active material in anodes for lithium-ion batteries, SEI formation can be reduced and the initial Coulomb efficiency can be enhanced.

The silicon in the silicon-containing material, deposited from the silicon precursor, may further comprise dopants, selected for example from the group containing Li, Fe, Al, Cu, Ca, K, Na, S, Cl, Zr, Ti, Pt, Ni, Cr, Sn, Mg, Ag, Co, Zn, B, P, Sb, Pb, Ge, Bi, rare earths, or combinations thereof. Preference here is given to lithium and/or tin. The amount of dopants in the silicon-containing material is preferably at most 1 wt % and more preferably at most 100 ppm, based on the total weight of the silicon-containing material, determinable by means of ICP-OES.

The silicon-containing material generally has a surprisingly high stability under compressive and/or shearing load. The pressure stability and the shear stability of the silicon-containing material are manifested, for example, by the absence or virtual absence of changes in the porous structure of the silicon-containing material in the SEM under compressive load (for example on electrode compaction) and, respectively, shearing load (for example, on preparation of the electrodes).

The silicon-containing material may optionally further comprise elements, such as carbon. Carbon is present preferably in the form of thin layers having a layer thickness of at most 1 μm, preferably less than 100 nm, more preferably less than 5 nm, and very preferably less than 1 nm (determinable via SEM or HR-TEM). These carbon layers may be present both in the pores and on the surface of the silicon-containing material. The sequence of different layers in the silicon-containing material through corresponding repetitions of Phases 2.1 to 6.1, and also their number, are also arbitrary. Accordingly, there may first be a layer, on the porous particles, of a further material, different from the porous particles, such as carbon, for example, and that layer may bear a silicon layer or a layer of silicon particles. Also possible is the presence, on the silicon layer or on the layer of silicon particles, of a layer, in turn, of a further material, which may be different from or the same as the material of the porous particles, irrespective of whether, between the porous particles and the silicon layer or the layer consisting of silicon particles, there is a further layer of a material different from the material of the porous particles.

The silicon-containing material contains preferably ≤50 wt %, more preferably ≤40 wt % and especially preferably ≤20 wt % of additional elements. The silicon-containing material contains preferably ≥1 wt %, more preferably ≥3 wt % and especially preferably ≥2 wt % of additional elements.

The figures in wt % are based on the total weight of the silicon-containing material. In an alternative embodiment, the silicon-containing material contains no additional elements.

A further subject of the invention is the use of the silicon-containing material as an active material in anode materials for anodes of lithium-ion batteries, and also the use of such anodes for producing lithium-ion batteries.

The anode material is based preferably on a mixture comprising the silicon-containing material accessible by the process of the invention, one or more binders, optionally graphite as further active material, optionally one or more further electrically conducting components, and optionally one or more additives.

Through the use of further electrically conducting components in the anode material it is possible to reduce the contact resistances within the electrode and also between electrode and current collector, thereby improving the current-carrying capacity of the lithium-ion battery of the invention. Examples of preferred further electrically conducting components are conductive carbon black, carbon nanotubes or metallic particles, such as copper, for example.

The primary particles of conductive carbon black preferably have a volume-weighted particle size distribution between the diameter percentiles $d_{10}$=5 nm and $d_{90}$=200 nm. The primary particles of conductive carbon black may also have chainlike branching and form structures of up to μm size. Carbon nanotubes preferably have diameters of 0.4 to 200 nm, more preferably 2 to 100 nm and most preferably 5 to 30 nm. The metallic particles have a volume-weighted particle size distribution which lies preferably between the diameter percentiles $d_{10}$=5 nm and $d_{90}$=800 nm.

The anode material comprises preferably 0 to 95 wt %, more preferably 0 to 40 wt % and most preferably 0 to 25 wt % of one or more further electrically conducting components, based on the total weight of the anode material.

In the anodes for lithium-ion batteries, the silicon-containing material may be present at preferably 5 to 100 wt %, more preferably 30 to 100 wt % and most preferably 60 to 100 wt %, based on the total active material present in the anode material.

Preferred binders are polyacrylic acid or the alkali metal salts thereof, more particularly lithium salts or sodium salts, polyvinyl alcohols, cellulose or cellulose derivatives, polyvinylidene fluoride, polytetrafluoroethylene, polyolefins, polyimides, especially polyamideimides, or thermoplastic elastomers, especially ethylene-propylene-diene terpolymers. Particularly preferred are polyacrylic acid, polymethacrylic acid or cellulose derivatives, especially carboxymethylcellulose. Particular preferred also are the alkali metal salts, especially lithium salts or sodium salts, of the aforesaid binders. The most preferred are the alkali metal salts, especially lithium salts or sodium salts, of polyacrylic acid or of polymethacrylic acid. All or preferably a proportion of the acid groups of a binder may be present in the form of salts. The binders have a molar mass of preferably 100000 to 1000000 g/mol. Mixtures of two or more binders may also be used.

As graphite it is possible generally to use natural or synthetic graphite. The graphite particles preferably have a volume-weighted particle size distribution between the diameter percentiles $d_{10}$>0.2 μm and $d_{90}$<200 μm.

Examples of additives are pore formers, dispersants, flow control agents or dopants, an example being elemental lithium.

Preferred formulations for the anode material comprise preferably 5 to 95 wt %, more particularly 60 to 90 wt %, of the silicon-containing material, 0 to 90 wt %, more particularly 0 to 40 wt %, of further electrically conducting components, 0 to 90 wt %, more particularly 5 to 40 wt %, of graphite, 0 to 25 wt %, more particularly 5 to 20 wt %, of binders and 0 to 80 wt %, more particularly 0.1 to 5 wt %, of additives, with the figures in wt % being based on the total weight of the anode material and with the fractions of all the constituents of the anode material adding up to a sum of 100 wt %.

The constituents of the anode material making up an anode ink or anode paste are processed preferably in a solvent, preferably selected from the group encompassing water, hexane, toluene, tetrahydrofuran, N-methylpyrrolidone, N-ethylpyrrolidone, acetone, ethyl acetate, dimethyl sulfoxide, dimethylacetamide and ethanol, and also mixtures of these solvents, preferably using rotor-stator machines, high-energy mills, planetary kneaders, stirred ballmills, shaking plates or ultrasonic apparatuses.

The anode ink or anode paste has a pH of preferably 2 to 7.5 (determined at 20° C., using, for example, the WTW pH 340i pH meter with SenTix RJD probe).

The anode ink or anode paste can be applied by doctor blade, for example, to a copper foil or another current collector. Other coating methods, such as rotational coating (spin coating), roller coating, dipping or slot-die coating, painting or spraying, for example, may also be used in accordance with the invention.

Before the copper foil is coated with the anode material of the invention, the copper foil may undergo treatment with a commercial primer, based for example on polymer resins or silanes. Primers can lead to an improvement in the adhesion to the copper, but themselves generally possess virtually no electrochemical activity.

The anode material is generally dried to constant weight. The drying temperature is guided by the components used and by the solvent employed. It is situated preferably between 2° and 300° C., more preferably between 5° and 150° C. The layer thickness, meaning the dry layer thickness of the anode coating, is preferably 2 to 500 μm, more preferably from 10 to 300 μm.

Lastly, the electrode coatings may be calendered, in order to set a defined porosity. The electrodes thus produced preferably have porosities of 15 to 85%, which can be determined via mercury porosimetry in accordance with DIN ISO 15901-1. Here, preferably 25 to 85% of the pore volume which can be determined in this way is provided by pores which have a pore diameter of 0.01 to 2 μm.

A further subject of the invention is a lithium-ion battery comprising a cathode, an anode, two electrically conducting connections to the electrodes, a separator, and an electrolyte, with which the separator and the two electrodes are impregnated, and also a casing accommodating the stated components, wherein the anode comprises silicon-containing material accessible according to the process of the invention.

In the context of this invention, the term lithium-ion battery also encompasses cells. Cells generally comprise a cathode, an anode, a separator and an electrolyte. Besides one or more cells, lithium-ion batteries preferably further comprise a battery management system. Battery management systems serve generally to control batteries, by means of electronic circuits, for example, especially for recognizing the charge state, for protection from exhaustive discharge, or for protection against overcharging.

Preferred cathode materials which can be used in accordance with the invention include lithium cobalt oxide, lithium nickel oxide, lithium nickel cobalt oxide (doped or undoped), lithium manganese oxide (spinel), lithium nickel cobalt manganese oxides, lithium nickel manganese oxides, lithium iron phosphate, lithium cobalt phosphate, lithium manganese phosphate, lithium vanadium phosphate, or lithium vanadium oxides.

The separator is generally an electrically insulating, ion-permeable membrane, preferably made of polyolefins, for example polyethylene (PE) or polypropylene (PP), or polyester, or corresponding laminates. Alternatively, as is customary within battery manufacture, the separator may consist of or be coated with glass or ceramic materials. The separator, conventionally, separates the first electrode from the second electrode and therefore prevents electronically conducting connections between the electrodes (short circuiting).

The electrolyte is preferably a solution comprising one or more lithium salts (=conductive salt) in an aprotic solvent. Conductive salts are preferably selected from the group containing lithium hexafluorophosphate, lithium hexafluoroarsenate, lithium perchlorate, lithium tetrafluoroborate, lithium imides, lithium methides, lithium trifluoromethanesulfonate $LiCF_3SO_3$, lithium bis(trifluoromethanesulfonimide) $LiN(CF_3SO_2)_2$ and lithium borates. The concentration of the conductive salt, based on the solvent, is preferably between 0.5 mol/l and the solubility limit of the salt in question. More preferably it is 0.8 to 1.2 mol/l.

Solvents used are preferably cyclic carbonates, propylene carbonate, ethylene carbonate, fluoroethylene carbonate, dimethyl carbonate, diethyl carbonate, ethyl methyl carbonate, dimethoxyethane, diethoxyethane, tetrahydrofuran, 2-methyltetrahydrofuran, gamma-butyrolactone, dioxolane, acetonitrile, organic esters of carbonic acid, or nitriles, individually or as mixtures thereof.

The electrolyte preferably comprises a film former, such as vinylene carbonate or fluoroethylene carbonate, for example. In this way it is possible to achieve a significant improvement in the cycling stability of the anodes comprising the silicon-containing material obtained according to the process of the invention. This improvement is ascribed primarily to the formation of a solid electrolyte interphase on the surface of active particles. The fraction of the film former in the electrolyte is preferably between 0.1 and 20.0 wt %, more preferably between 0.2 and 15.0 wt % and most preferably between 0.5 and 10 wt %.

In order to match the actual capacities of the electrodes of a lithium-ion cell to one another in an as optimal a way as possible, it is advantageous to balance out, in terms of quantity, the materials for the positive and negative electrodes. Of particular importance in this context is the fact that, in the first or initial charging/discharging cycle of secondary lithium-ion cells (known as activation), a covering layer is formed on the surface of the electrochemically active materials in the anode. This covering layer is referred to as a solid electrolyte interphase (SEI) and consists in general mainly of electrolyte decomposition products and also a certain amount of lithium, which is accordingly no longer available for further charging/discharging reactions. The thickness and composition of the SEI are dependent on the nature and the quality of the anode material used and of the electrolyte solution used.

In the case of graphite, the SEI is particularly thin. On graphite there is a loss of typically 5 to 35% of the mobile lithium in the first charging step. There is also, correspondingly, a drop in the reversible capacity of the battery.

In the case of anodes with the silicon-containing active material obtained by the process of the invention, the first charging step is accompanied by a loss of mobile lithium of preferably at most 30%, more preferably at most 20% and most preferably at most 10%, which is well below the values described in the prior art, such as in U.S. Pat. No. 10,147,950 B1, for example.

A lithium-ion battery whose anode comprises a silicon-containing material obtainable by the process of the invention may be produced in all customary forms, such as in rolled, folded or stacked form, for example.

All substances and materials utilized for the production of such lithium-ion batteries as described above are known. Production of the parts of such batteries, and their assembly to give batteries, take place in accordance with the processes known within the field of battery manufacture.

The silicon-containing material obtained with the process of the invention is notable for significantly improved electrochemical characteristics, and leads to lithium-ion batteries having high volumetric capacities and outstanding performance properties.

The silicon-containing material obtained by the process of the invention is permeable to lithium ions and also electrons, and therefore allows charged transport. The SEI in lithium-ion batteries can be reduced to a large extent with the silicon-containing material obtained by the process of the invention. In addition, because of the design of the silicon-containing material obtained with the process of the invention, there is no longer any detachment, or at least greatly reduced detachment, of the SEI from the surface of the active material. All of this results in a high cycling stability on the part of such lithium-ion batteries whose anodes contain the silicon-containing material obtainable by the process of the invention.

The examples which follow serve for further elucidation of the invention described here.

Analytical methods and instruments used for the characterization were as follows:

Inorganic Analysis/Elemental Analysis:

The C contents reported in the examples were ascertained using a Leco CS 230 analyser; for determination of O and, where appropriate N and H contents, a Leco TCH-600 analyser was used. The qualitative and quantitative determination of other reported elements took place by means of ICP (inductively coupled plasma) emission spectrometry (Optima 7300 DV, from Perkin Elmer). For this analysis, the samples were subjected to acid digestion ($HF/HNO_3$) in a microwave (Microwave 3000, from Anton Paar). The ICP-OES determination is guided by ISO 11885 "Water quality—Determination of selected elements by inductively coupled plasma optical emission spectrometry (ICP-OES) (ISO 11885:2007); German version EN ISO 11885:2009", which is used for analysis of acidic, aqueous solutions (e.g., acidified samples of drinking water, wastewater and other water, aqua regia extracts of soils and sediments).

Particle Size Determination:

The particle size distribution was determined in the context of this invention according to ISO 13320 by means of static laser scattering using a Horiba LA 950. In the preparation of the samples, particular attention must be paid here to the dispersing of the particles in the measurement solution, so as not to measure the size of agglomerates rather than that of individual particles. For the measurement, the particles were dispersed in ethanol. For this purpose the dispersion, prior to the measurement, was treated as and when required with 250 W ultrasound in a Hielscher model UIS250v ultrasound laboratory instrument with LS24d5 sonotrode for 4 minutes.

BET Surface Area Measurement:

The specific surface area of the materials was measured via gas adsorption with nitrogen, using a Sorptomatic 199090 instrument (Porotec) or an SA-9603MP instrument (Horiba) by the BET method (determination according to DIN ISO 9277:2003-05 with nitrogen).

Skeletal Density:

The skeletal density, i.e., the density of the porous solid based on the volume exclusively of the pore spaces gas-accessible from the outside, was determined by means of He pycnometry in accordance with DIN 66137-2.

Gas-Accessible Pore Volume:

The Gurwitsch gas-accessible pore volume was determined by gas sorption measurements with nitrogen in accordance with DIN 66134.

Materials and apparatuses used when carrying out experimental examples were as follows:

The reactors A, B and C used consisted of a cylindrical lower part (beaker) and a lid with a number of connections (for example, for gas supply, gas removal, temperature measurement and pressure measurement). The volume of each of the three reactors was 12 litres. The reactors were heated electrically. The temperature was measured fundamentally between the heater and the reactor. The stirrers used were very close-clearance helical stirrers. The height of these stirrers was around 50% of the clear height of the reactor interior.

In Counter-Example 2, not in accordance with the invention, the reactor used was identical, with the particular feature that reactor A, B and C was the same reactor and there was no transfer of the material between the steps.

The $SiH_4$ used, of grade 4.0, was acquired from Linde GmbH.

The porous particles used in the example had the following properties:

Density: 2.19 g/cm$^3$ (He pycnometry)
BET surface area: 2255 m$^2$/g
Gurvich volume: 1.16 cm$^3$/g
Carbon content: 93.39 wt % (EA)
Oxygen content: 5.45 wt % (EA)
Hydrogen content: 0.70 wt % (EA)
Micropore volume: 0.46 cm$^3$/g
Particle size distribution: $d_{50}$ 4.4 μm

EXAMPLE 1

Production of Silicon-Containing Materials Using Monosilane $SiH_4$ as Silicon Precursor in the Cascade Reactor System.

In Phase 1.1 reactor A was filled with 842 g of porous material, the porous particles, and sealed. In Phase 1.2 reactor A was then conditioned to 350° C. and evacuated for 240 minutes to a final pressure of $1*10^{-3}$ bar. In Phase 1.3 the material was subsequently transferred under a nitrogen atmosphere into reactor B, which was heated to 350° C.

In Phase 2.1 the porous material in reactor B was heated to 350° C. In Phase 2.2 reactor B was first evacuated to 1*10-3 bar. Subsequently in Phase 2.4 an amount of 158 g of $SiH_4$ was charged with a pressure of 15.0 bar. In Phase 3.1 and 4.1, reactor B was heated over 15 minutes to a temperature of 430° C., and in Phase 4.2 the temperature was maintained for 70 minutes. In the course of Phase 4.2, and in accordance with equation 2, the pressure rose to 35.8 bar. Subsequently the pressure in reactor B was reduced in Phase 5.1 to 1.5 bar and in Phase 5.2 the temperature of the reactor was reduced to 350° C.

Thereafter Phases 2.4, 3.1, 4.1, 4.2, 5.1 and 5.2 were run ten times in the specified orders. During this operation, x g of $SiH_4$ was metered in the specified order in the various Phases 2.4 (x=139, 133, 131, 128, 122, 119, 116, 114, 110, 77), during which initially a pressure of y bar was established (y=15.0; 15.0; 15.0; 15.0; 15.0; 15.0; 15.0; 15.0; 14.9; 11.0). In all ten cases reactor B, in Phase 3.1 and 4.1, was heated over 15 minutes to a temperature of 430° C., the temperature being maintained for 60 minutes in the iterations of Phase 4.2. In the course of Phase 4.2, and in agreement with equation 2, the pressure rose to z bar (z=35.6; 35.0; 34.2; 33.4; 33.1; 32.6; 32.0; 31.5; 31.8; 23.4). Following Phase 4.2 of the first nine repetitions, the pressure in Phase 5.1 was reduced to 1.5 bar and reactor B cooled down over 30 minutes in Phase 5.2 to a temperature of 350° C. Following the tenth and last repetition of Phase 4.2, and with omission of Phase 5, the pressure in reactor B was reduced in Phase 6.1 to 1.0 bar. The hot material was subsequently transferred in Phase 6.2 through a tube connection into reactor C. In Phase 6.3 a pressure of 4.5 bar was generated in reactor C with nitrogen, and the silicon-containing material cooled down in reactor C over 90 minutes to a temperature of 70° C. Subsequently in Phase 7.1 reactor C was purged five times with nitrogen, ten times with lean air having an oxygen fraction of 5%, ten times with lean air having an oxygen fraction of 10%, ten times with lean air having an oxygen fraction of 15% and subsequently ten times with air. In Phase 7.2 an amount of 1992 g of a silicon-containing material in the form of a fine black solid was isolated. The silicon-containing material had the following properties BET surface area: 43 m$^2$/g
Carbon content: 40.2 wt % (EA)
Oxygen content: 2.77 wt % (EA)
Silicon content: 57.0 wt % (EA)

In all the operation lasted 36 hours. The three reactors were all in operation simultaneously; the time-determining step for the cascade reactor is the operation in reactor B, and in this case was 18 h.

COUNTER-EXAMPLE 2 (NOT IN ACCORDANCE WITH THE INVENTION)

Production of silicon-containing materials using monosilane $SiH_4$ as silicon precursor in the reactor (for the counter-example, reactor A, B and C from Example 1 are the same pressure vessel).

In Phase 1.1 the reactor was filled with 842 g of porous material and sealed. In Phase 1.2 the reactor was then conditioned to 350° C. and evacuated for 240 minutes to a final pressure of $1*10^{-3}$ bar. Subsequently in Phase 2.4 an amount of 318 g of $SiH_4$ was charged with a pressure of 15.0 bar. In Phase 3.1 and 4.1, the reactor was heated over 15 minutes to a temperature of 430° C., and in Phase 4.2 the temperature was maintained for 70 minutes. In the course of Phase 4.2, and in accordance with equation 2, the pressure rose to 35.8 bar. Subsequently the pressure in the reactor was reduced in Phase 5.1 to 1.5 bar and in Phase 5.2 the temperature of the reactor was reduced to 350° C. Thereafter Phases 2.4, 3.1, 4.1, 4.2, 5.1 and 5.2 were run ten times in the specified orders. During this operation, x g of $SiH_4$ was metered in the specified order in the various Phases 2.4 (x=137, 130, 131, 130, 123, 120, 118, 116, 111, 75), during which initially a pressure of y bar was established (y=15.0; 15.0; 15.0; 15.0; 15.0; 15.0; 14.9; 15.0; 15.0; 11.0). In all ten cases the reactor, in Phase 3.1 and 4.1, was heated over 15 minutes to a temperature of 430° C., the temperature being maintained for 60 minutes in Phase 4.2. In the course of Phase 4.2, and in agreement with equation 2, the pressure rose to z bar (z=35.7; 35.2; 34.0; 33.3; 33.1; 32.8; 32.0; 31.3; 31.5; 23.74). Following Phase 4.2 of the first nine repetitions, the pressure in Phase 5.1 was reduced to 1.5 bar and the reactor cooled down over 30 minutes in Phase 5.2 to a temperature of 350° C. Following the tenth and last repetition of Phase 4.2, and with omission of Phase 5, the pressure in the reactor was reduced in Phase 6.1 to 1.0 bar. In Phase 6.3 a pressure of 4.5 bar was generated in the reactor with nitrogen, and the silicon-containing material cooled down over 14 hours to a temperature of 70° C. Subsequently in Phase 7.1 the reactor was purged five times with nitrogen, ten times with lean air having an oxygen fraction of 5%, ten times with lean air having an oxygen fraction of 10%, ten times with lean air having an oxygen fraction of 15% and subsequently ten times with air. In Phase 7.2 an amount of 1986 g of a silicon-containing material in the form of a fine black solid was isolated. The silicon-containing material had the following properties BET surface area: 39 $m^2/g$ Carbon content: 39.6 wt % (EA)

Oxygen content: 2.87 wt % (EA)

Silicon content: 57.0 wt % (EA)

In all the operation lasted 47 hours.

EXAMPLE 3

Electrochemical Characterization of the Silicon-Containing Materials in Use as Active Materials in Anodes of Lithium-Ion Batteries:

29.71 g of polyacrylic acid (dried to constant weight at 85° C.; Sigma-Aldrich, Mw ~450000 g/mol) and 756.6 g of deionized water were agitated by means of a shaker (290 1/min) for 2.5 h until complete dissolution of the polyacrylic acid. Lithium hydroxide monohydrate (Sigma-Aldrich) was added in portions to the solution until the pH was 7.0 (measured using WTW pH 340i pH meter and SenTix RJD probe). The solution was subsequently mixed by means of a shaker for a further 4 h. 3.87 g of the neutralized polyacrylic acid solution and 0.96 g of graphite (Imerys, KS6L C) were introduced into a 50 ml vessel and combined in a planetary mixer (SpeedMixer, DAC 150 SP) at 2000 rpm. Next, 3.40 g of each of the silicon-containing materials from Examples 1 and 2 were stirred in at 2000 rpm for 1 min. Then 1.21 g of an 8% dispersion of conductive carbon black and 0.8 g of deionized water were added and were incorporated at 2000 rpm on the planetary mixer. Dispersing then took place in the dissolver for 30 min at 3000 rpm and a constant 20° C. The ink was degassed again in the planetary mixer at 2500 rpm for 5 min under reduced pressure. The completed dispersion was then applied by means of a film applicator frame having a 0.1 mm gap height (Erichsen, Modell 360) to a copper foil having a thickness of 0.03 mm (Schlenk Metallfolien, SE-Cu58). The anode coating thus produced was subsequently dried for 60 min at 50° C. under an air pressure of 1 bar. The mean basis weight of the dried anode coating was 2.1 $mg/cm^2$ and the coating density was 0.9 $g/cm^3$.

The electrochemical studies were carried out on a button cell (CR2032 type, Hohsen Corp.) in a two-electrode arrangement. The electrode coating was used as counter-electrode or negative electrode (Dm=15 mm); a coating based on lithium nickel manganese cobalt oxide 6:2:2 with a content of 94.0% and a mean basis weight of 15.9 $mg/cm^2$ (obtained from the company SEI) was used as the working electrode or positive electrode (Dm=15 mm). A glass fibre filter paper (Whatman, GD type D) impregnated with 60 μl of electrolyte served as the separator (Dm=16 mm). The electrolyte used consisted of a 1.0 molar solution of lithium hexafluorophosphate in a 1:4 (v/v) mixture of fluoroethylene carbonate and diethyl carbonate. The cell was constructed in a glovebox (<1 ppm $H_2O$, $O_2$); the water content in the dry mass of all the components used was below 20 ppm.

Electrochemical testing was carried out at 20° C. The cell was charged by the cc/cv (constant current/constant voltage) method with a constant current of 5 mA/g (corresponding to C/25) in the first cycle and of 60 mA/g (corresponding to C/2) in the subsequent cycles, and, after the voltage limit of 4.2 V had been reached, charging took place with constant voltage until a current fell below 1.2 mA/g (corresponding to C/100) or 15 mA/g (corresponding to C/8). The cell was discharged by the cc (constant current) method with a constant current of 5 mA/g (corresponding to C/25) in the first cycle and of 60 mA/g (corresponding to C/2) in the subsequent cycles, until the voltage limit of 2.5 V was reached. The specific current selected was based on the weight of the coating of the positive electrode. The ratio of cell charge capacity to cell discharge capacity is referred to as the Coulomb efficiency. The electrodes were selected such as to establish a capacity ratio of cathode to anode of 1:1.2.

The results of the electrochemical testing of the full cell of lithium-ion batteries comprising the active materials from Examples 1 and 2 are set out in Table 1.

TABLE 1

Analytical data of the silicon-containing materials:

| Example No. | Silicon content [wt %](ICP) | BET surface area [$m^2/g$] | Oxygen content [wt %] (EA) | Rev. spec. anode capacity in the 2nd cycle [mAh/g] | Number of cycles with ≥80% capacity retention | Coulomb efficiency to activation [%] |
|---|---|---|---|---|---|---|
| 1 | 57 | 43 | 2.77 | 1120 | 430 | 84 |
| 2* | 57 | 39 | 2.87 | 1080 | 398 | 83 |

*not in accordance with the invention

In comparative example 2, 1986 g of material were produced in a reactor having a volume of 12 l by a process not in accordance with the invention over the course of 48 h; in Example 1, 1992 g of material were produced by the process according to the invention in three reactors with a volume of 12 l over the course of 18 hours. Accordingly, in Example 1, the yield of material was greater by a factor of 2.5 in terms of time, as compared with the case of Example 2.

The invention claimed is:

1. Process for producing silicon-containing materials, comprising:

wherein the silicon-containing materials are produced by thermal decomposition of one or more silicon precursors in the presence of one or more porous particles, wherein an amount of silicon is deposited in pores and on the surface of the one or more porous particles, in a cascade reactor system comprising a plurality of reactors; and wherein the process comprises at least the following Phases 1 to 7:

Phase 1: filling at least a portion of a reactor A with the one or more porous particles and pretreating the one or more porous particles, Phase 2: transferring the pretreated one or more porous particles into a reactor B and charging the reactor B with a reactive component comprising at least one silicon precursor, Phase 3: heating the reactor B to a target temperature, at which the silicon precursor begins to decompose in the reactor B, Phase 4: decomposing the silicon precursor, with deposition of silicon in pores and on the surface of the one or more porous particles, with formation of the silicon- containing materials and with a pressure within the reactor B increasing to at least 7 bar, Phase 5: cooling the reactor B, Phase 6: removing gaseous reaction products, formed in the course of the deposition, from the reactor B and transferring the silicon-containing materials into a reactor C, and Phase 7: withdrawing the silicon-containing materials from the reactor C.

2. The process of claim 1, wherein the Phase 1 is configured as follows:

Phase 1.1: filling the reactor A with the one or more porous particles,

Phase 1.2: pretreating the one or more porous particles in reactor A, and

Phase 1.3: transferring the pretreated particles into the reactor B, or interim storage into a reservoir vessel D and subsequent transfer into the reactor B.

3. The process of claim 1, wherein the Phase 2 is configured as follows:

Phase 2.1: heating or cooling of the one or more porous particles in reactor B, and Phase 2.4: charging the reactor B with at least one reactive component comprising at least one silicon precursor.

4. The process of claim 1, wherein the Phase 3 is configured as follows:

Phase 3.1: heating the reactor B to a target temperature, at which the reactive component begins to decompose in reactor B.

5. The process of claim 1, wherein the Phase 4 is configured as follows:

Phase 4.1: decomposing the silicon precursor, with deposition of silicon in pores and on the surface of the one or more porous particles, with the pressure within reactor B increasing to at least 7 bar, and Phase 4.2: establishing a minimum temperature or a temperature profile for a defined period in which a pressure of at least 7 bar comes about.

6. The process of claim 5, wherein the pressure in reactor B in Phase 4.1 and 4.2 reaches at least 10 bar.

7. The process of claim 5, wherein the temperature in reactor B in Phase 4.1 and 4.2 is in the range from 100 to 1000° C.

8. The process of claim 1, wherein the Phase 5 is configured as follows:

Phase 5.1: adjusting the pressure in reactor B to a defined pressure, and

Phase 5.2: cooling the reactor B to a defined temperature or a defined temperature profile.

9. The process of claim 1, wherein the Phase 7 is configured as follows:

Phase 7.1: after treating the silicon-containing materials in reactor C to deactivate their surfaces, and Phase 7.2: cooling the silicon-containing materials to a defined temperature and withdrawing the silicon-containing materials from reactor C.

10. The process of claim 1, wherein the silicon precursor comprises at least one reactive component which is selected from silicon-hydrogen compounds, chlorine- containing silanes, and also higher linear, branched or cyclic homologs of chlorine-containing silanes, chlorinated and part-chlorinated oligo-and polysilanes, methylchlorosilanes or mixtures thereof.

11. The process of claim 1, wherein the one or more porous particles are selected from amorphous carbons, silicon dioxide, boron nitride, silicon carbide and silicon nitride or else hybrid materials based on these materials.

* * * * *